US011814291B2

(12) United States Patent
Sundararaj et al.

(10) Patent No.: US 11,814,291 B2
(45) Date of Patent: Nov. 14, 2023

(54) NANOMATERIALS, NANOCOMPOSITE MATERIALS, AND METHODS THEREOF

(71) Applicant: UTI LIMITED PARTNERSHIP, Calgary (CA)

(72) Inventors: Uttandaraman Sundararaj, Calgary (CA); Mohammad Asgari, Toronto (CA)

(73) Assignee: UTI Limited Partnership, Calgary (CA)

( * ) Notice: Subject to any disclaimer, the term of this patent is extended or adjusted under 35 U.S.C. 154(b) by 148 days.

(21) Appl. No.: 17/415,987

(22) PCT Filed: Dec. 18, 2019

(86) PCT No.: PCT/CA2019/051840
§ 371 (c)(1),
(2) Date: Jun. 18, 2021

(87) PCT Pub. No.: WO2020/124226
PCT Pub. Date: Jun. 25, 2020

(65) Prior Publication Data
US 2022/0073353 A1    Mar. 10, 2022

Related U.S. Application Data

(60) Provisional application No. 62/783,825, filed on Dec. 21, 2018.

(51) Int. Cl.
*C01B 32/168*  (2017.01)
*C08K 3/04*  (2006.01)
(Continued)

(52) U.S. Cl.
CPC ......... *C01B 32/168* (2017.08); *B01J 31/2239* (2013.01); *B01J 37/08* (2013.01);
(Continued)

(58) Field of Classification Search
CPC ..... C01B 32/168; C01B 32/162; C01B 33/40; C01B 2202/22; C01B 33/20; C01B 32/15; C01B 32/158; C01B 32/16; B01J 31/2239; B01J 37/08; B01J 37/16; B01J 2531/842; B01J 31/069; C08K 3/041; C08K 9/02; C08K 2201/011; C08K 3/346;
(Continued)

(56) References Cited

U.S. PATENT DOCUMENTS

2012/0128878  A1*  5/2012  Li .......................... B82Y 30/00
977/843

FOREIGN PATENT DOCUMENTS

KR      100860828  B1      9/2008
KR      101673599  B1      11/2016

OTHER PUBLICATIONS

Zhang, et al., Growth of Carbon Nanotubes on Clay: Unique Nanostructured Filler for High-Performance Polymer Nanocomposites, Adv. Mater. 2006; 18: 73-77 (Year: 2006).*
(Continued)

*Primary Examiner* — Daniel C. McCracken
(74) *Attorney, Agent, or Firm* — Clark & Elbing LLP

(57)  ABSTRACT

The present invention relates to a nanomaterial comprising a nanoclay having a layered structure and carbon nanotubes being intercalated between layers of the layered of the nanoclay, and manufacturing method thereof.

11 Claims, 12 Drawing Sheets

(51) Int. Cl.
   C01B 32/162    (2017.01)
   B01J 31/22     (2006.01)
   B01J 37/08     (2006.01)
   B01J 37/16     (2006.01)
   C01B 33/40     (2006.01)
   C08K 9/02      (2006.01)
   B82Y 30/00     (2011.01)

(52) U.S. Cl.
   CPC ............ *B01J 37/16* (2013.01); *C01B 32/162* (2017.08); *C01B 33/40* (2013.01); *C08K 3/041* (2017.05); *C08K 9/02* (2013.01); *B01J 2531/842* (2013.01); *B82Y 30/00* (2013.01); *C01B 2202/22* (2013.01); *C01P 2002/08* (2013.01); *C01P 2002/82* (2013.01); *C08K 2201/011* (2013.01)

(58) Field of Classification Search
   CPC .. B82Y 30/00; C01P 2002/08; C01P 2002/82; C01P 2006/40; C01P 2004/54; C09C 1/0081; C09C 1/44; C09C 1/42; C30B 25/00; C30B 29/602; C30B 29/68
   See application file for complete search history.

(56) References Cited

OTHER PUBLICATIONS

Yamanaka, et al., Iron Oxide Pillared Clay, Catalysis Today 1988; 2: 261-270 (Year: 1988).*
Tripathi, et al., Fine-tuning control on CNT diameter distribution, length and density using thermal CVD growth at atmospheric pressure: and in-depth analysis of the role of flow rate and flow duration of acetylene (C2H2) gas, Appl. Nanosci. 2015; 5: 19-28 (Year: 2015).*
Gournis, et al., Catalytic synthesis of carbon nanotubes on clay minerals, Carbon 2002; 40: 2641-2646 (Year: 2002).*
Zhang, et al., Mass production of aligned carbon nanotube arrays by fluidized bed catalytic chemical vapor deposition, Carbon 2010 : 1196-1209 (Year: 2010).*
Al-Saleh et al., "Electromagnetic Interference Shielding Mechanisms of CNT/Polymer Composites," Carbon 47(7):1738-1746 (2009) (9 pages).
Asgari et al., "Pre-exfoliated Nanoclay Through Two Consecutive Reaction Systems: Silane Functionalization Followed by Grafting of Amino Acid Monomers," Applied Clay Science 151:81- 91 (2018) (11 pages).
Asgari et al., "Silane Functionalization of Sodium Montmorillonite Nanoclay and Its Effect on Rheological and Mechanical Properties of HDPE/Clay Nanocomposites," Applied Clay Science 146:439-448 (2017) (11 pages).
Asgari et al., "Silane Functionalization of Sodium Montmorillonite Nanoclay: the Effect of Dispersing Media on Intercalation and Chemical Grafting," Applied Clay Science 153:228-238 (2018) (11 pages).
Ayyappan et al., "Nanoparticles of Nickel and Silver Produced by the Polyol Reduction of the Metal Salts Intercalated in Montmorillonite," Solid State Ionics 84:271-281 (1996) (11 pages).
Bakandritsos et al., "Carbon Nanotube Growth on a Swellable Clay Matrix," Chem. Mater. 17:3468-3474 (2005) (7 pages).
Berkheiser et al., "Hectorite Complexes With Cu(II) and Fe(II)-1,10-Phenanthroline Chelates," Clays and Clay Minerals 25:105-112 (1977) (8 pages).
Bronikowski et al., "Longer Nanotubes at Lower Temperatures: The Influence of Effective Activation Energies on Carbon Nanotube Growth by Thermal Chemical Vapor Deposition," The J. Phys. Chem. C. 111:17705-17712 (2007) (8 pages).
Bulusheva et al., "Electrochemical Properties of Nitrogen-Doped Carbon Nanotube Anode in Li-Ion Batteries," Carbon 49:4013-4023 (2011) (11 pages).

Che et al., "Chemical Vapor Deposition Based Synthesis of Carbon Nanotubes and Nanofibers Using a Template Method," Chem. Mater. 10:260-267 (1998) (8 pages).
Chen et al., Delaminated Fe2O3-Pillared Clay: Its Preparation, Characterization, and Activities for Selective Catalytic Reduction of No by NH3. Journal of Catalysis 151:135-146 (1995) (12 pages).
Chuc et al., "A Simple Approach to the Fabrication of Graphene-Carbon Nanotube Hybrid Films on Copper Substrate by Chemical Vapor Deposition," Journal of Materials Science Technology 31:479-483 (2015) (5 pages).
Couteau et al., "CVD Synthesis of High-Purity Multiwalled Carbon Nanotubes Using Caco3 Catalyst Support for Large-scale Production," Chemical Physics Letters 378:9-17 (2003) (9 pages).
Doff et al., "Preparation and Characterization of Iron Oxide Pillared Montmorillonite," Clay Minerals 23(4):367-377 (1988) (11 pages).
Ferrari et al., "Interpretation of Raman Spectra of Disordered and Amorphous Carbon," Physical Review 61:14095-14107 (2000) (13 pages).
Han et al., "A New Thermally Stable SiO2—Cr2O3 Sol Pillared Montmorillonite With High Surface Area," Applied Catalysis A: General 174:83-90 (1998) (8 pages).
Hewitt et al., "Multilayered Carbon Nanotube/Polymer Composite Based Thermoelectric Fabrics," Nano Letters, 12:1307-1310 (2012) (4 pages).
Huakang et al., "Effect of Iron Concentration on the Growth of Carbon Nanotubes on Clay Surface," ACS Applied Materials & Interfaces 4:1981-1989 (2012) (9 pages).
Huang et al., "Assembling Exfoliated Layered Double Hydroxide (LDH) Nanosheet/Carbon Nanotube (CNT) Hybrids via Electrostatic Force and Fabricating Nylon Nanocomposites," The Journal of Physical Chemistry B, 114:16766-16772 (2010) (7 pages).
International Preliminary Report on Patentability for International Application No. PCT/CA2019/051840 dated Jul. 1, 2021 (7 pages).
International Search Report and Written Opinion for International Patent Application No. PCT/CA2019/051840, dated Mar. 19, 2020 (9 pages).
Kaiser et al., "Heterogeneous Model for Conduction in Carbon Nanotubes," Physical Review B, 57:1418-1421 (1998) (4 pages).
Lau et al., "Cobalt Hydroxide Colloidal Particles Precipitation on Nanoclay Layers for the Formation of Novel Nanocomposites of Carbon Nanotubes/Nanoclay," Composites Science and Technology 66:450-458 (2006) (9 pages).
Lee et al., "Catalyst Effect on Carbon Nanotubes Synthesized by Thermal Chemical Vapor Deposition," Chemical Physics Letters, 360:250-255 (2002) (6 pages).
Madaleno et al., "Synthesis of Clay-Carbon Nanotube Hybrids: Growth of Carbon Nanotubes in Different Types of Iron Modified Montmorillonite," Composites Science and Technology 72:377-381 (2012) (5 pages).
Maes et al., "Study of Fe2o3-pillared Clays Synthesized Using the Trinuclear Fe(III)-Acetato Complex as Pillaring Precursor," Microporous Materials 4:43-51 (1995) (9 pages).
Maiti et al., "Polystyrene/MWCNT/Graphite Nanoplate Nanocomposites: Efficient Electromagnetic Interference Shielding Material through Graphite Nanoplate-MWCNT-Graphite Nanoplate Networking," ACS Applied Materials & Interfaces 5:4712-4724 (2013) (13 pages).
Manikandan et al., "Fabrication of Nanostructured Clay-carbon Nanotube Hybrid Nanofiller by Chemical Vapour Deposition," Applied Surface Science, 258:4460-4466 (2012) (7 pages).
Odom et al., "Atomic Structure and Electronic Properties of Single-walled Carbon Nanotubes," Nature 391:62-64 (1998) (3 pages).
Park et al.,"Intercalation of Magnesium-Urea Complex Into Swelling Clay," Journal of Physics and Chemistry of Solids 65:409-412 (2004) (4 pages).
Pötschke et al.,Rheological and Dielectrical Characterization of Melt Mixed Polycarbonate-multiwalled Carbon Nanotube Composites. Polymer 45:8863-8870 (2004) (8 pages).
Rightor et al., "Iron Oxide Pillared Clay With Large Gallery Height: Synthesis and Properties as a Fischer-Tropsch Catalyst," Journal of Catalysis 130:29-40 (1991) (12 pages).
Sankararamakrishnan et al., "Synthesis of Functionalized Carbon Nanotubes by Floating Catalytic Chemical Vapor Deposition Method

(56) References Cited

OTHER PUBLICATIONS and Their Sorption Behavior Toward Arsenic," Chemical Engineering Journal 284:599-608 (2016) (43 pages).
Shaijumon et al., "Catalytic Growth of Carbon Nanotubes Over NI/CR Hydrotalcite-type Anionic Clay and Their Hydrogen Storage Properties," Applied Surface Science 242:192-198 (2005) (7 pages).
Snow et al., "Chemical Detection with a Single-Walled Carbon Nanotube Capacitor," Science 307:1942-1945 (2005) (5 pages).
Spitalsky et al., "Carbon Nanotube-Polymer Composites: Chemistry, Processing, Mechanical and Electrical Properties," Progress in Polymer Science 35:357-401 (2010) (45 pages).
Thostenson et al., "Advances in the Science and Technology of Carbon Nanotubes and Their Composites: A Review," Composites Science and Technology 61:1899-1912 (2001) (14 pages).
Wei et a., "Synthesis of N-Doped Graphene by Chemical Vapor Deposition and Its Electrical Properties," Nano Letters 9:1752-1758 (2009) (7 pages).
Yamanaka et al., "High Surface Area Solids Obtained by Intercalation of Iron Oxide Pillars in Montmorillonite," Mat. Res. Bull. 19(2):161-168 (1984) (8 pages).
Zhao et al., "Raman Spectroscopy of Carbon-Nanotube-based Composites," Philosophical Transactions of the Royal Society A 362:2407-2424 (2004) (19 pages).
Zurita et al., "FE-pillared Clays: A Combination of Zeolite Shape Selectivity and Iron Activity in the Co Hydrogenation Reaction," Journal of Molecular Catalysis A 107:175-183 (1996) (9 pages).

\* cited by examiner

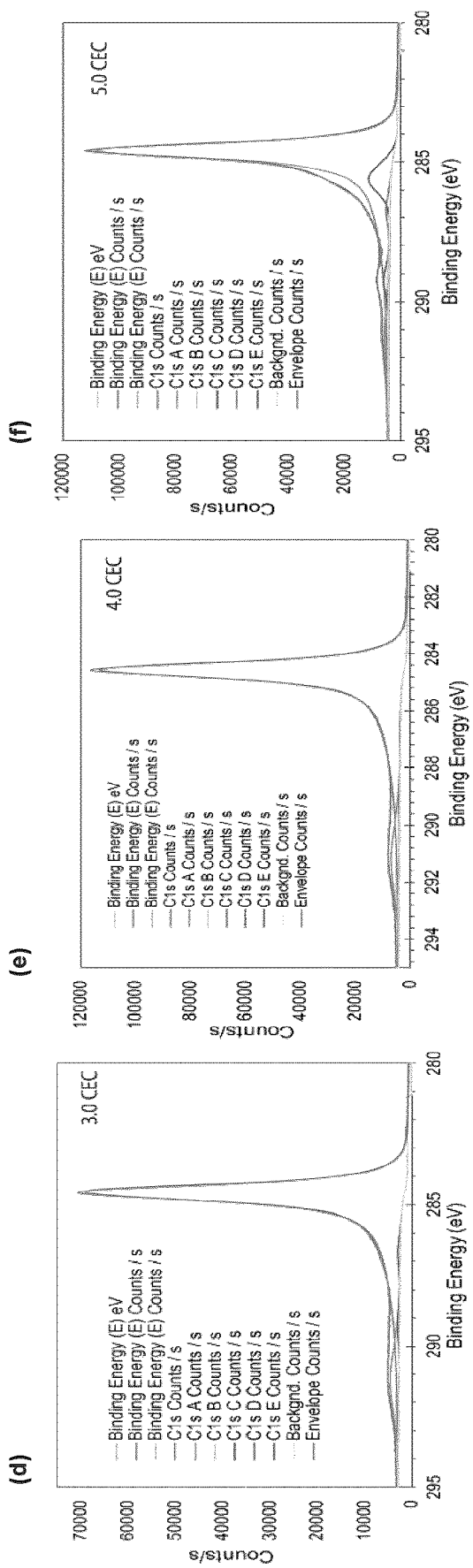
FIGURE 8 con't

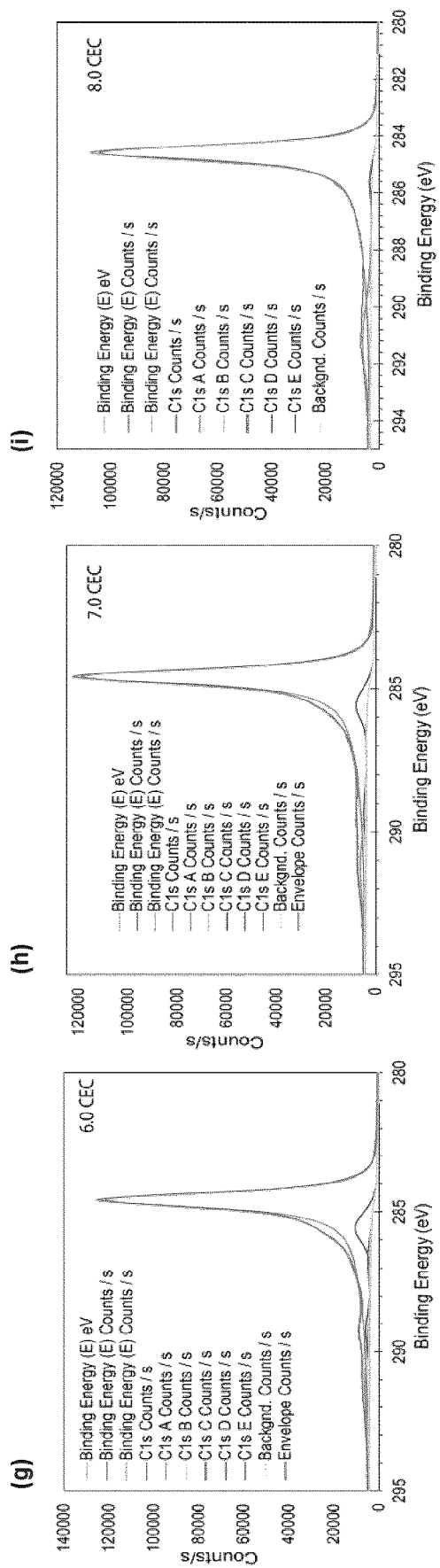
FIGURE 8 con't

NANOMATERIALS, NANOCOMPOSITE MATERIALS, AND METHODS THEREOF

CROSS REFERENCE TO RELATED APPLICATION

This application claims priority to U.S. Patent Application No. 62/783,825, filed Dec. 21, 2018, the entire contents of which is hereby incorporated by reference.

FIELD

The present disclosure relates generally to nanomaterials. More particularly, the present disclosure relates to nanomaterials, nanocomposite materials, and methods thereof.

BACKGROUND

Development of hybrid nanomaterials has attracted interest for a variety of polymer applications (e.g., polymer gas pipelines) due to advantages such as synergistic mechanical, thermal, electrical, and gas barrier properties. In situ synthesis of hybrid nanofillers is of particular interest because of synergistic properties that can be obtained. This is due to the ability to have more control over the dispersion of individual nanofillers, as compared to the addition of the nanofillers separately[1-6]. Clay minerals have a two dimensional layered structure with a unit layer thickness about one nm and planar dimension ranging from several nanometers to several micrometers. Each layer is formed of two tetrahedral sheets of coordinated silicon atoms attached to an edge-sharing octahedral sheet of either alumina or magnesia[7-9]. Nanoclay can be obtained on a large scale from nature at low cost and has been applied to a wide range of applications. It is well established that a small amount (less than two vol. %) of exfoliated montmorillonite in polymers could potentially increase mechanical, thermal, and gas barrier properties due to their exceptionally high surface area[8]. In addition, because of its strong adsorption, great surface area, and ion-exchange ability, nanoclay has been extensively used as a catalyst, and catalytic support for decades[4,10,11]. Carbon nanotube (CNT) is an ideal reinforcement nanofiller, with one of the highest Young's modulus and tensile strength among all materials. Among polymer nanocomposite manufacturers and researchers, CNTs have created significant excitement due to their unique features such as large surface area, high electrical and thermal conductivity, and outstanding mechanical properties. It has been demonstrated that metallic catalysts such as iron, nickel, or cobalt, which are created by the reduction of transition state metal salts, are effective catalysts for the synthesis of CNTs through chemical vapor deposition (CVD), which has been established as a simple and cost-efficient way of mass producing CNTs[12-19]. Generally, alumina has been used as the support for catalytic CVD growth of CNTs[20]. The yield, quality, and nature of CNTs produced by the CVD approach are affected by numerous parameters, including the carbon source feeding gas, deposition temperature of carbon source on the catalyst, and the catalyst support.

Growth of CNTs on montmorillonite (MMT) layers could create an interesting class of hybrid nanomaterials with advanced applications. Using nanoclay as a catalyst support and also as a secondary nanofiller to act as a hybrid with CNT could provide outstanding synergism in final properties, such as energy-absorption, barrier properties, charge storage, sensors, and polymer reinforcement. In addition, exfoliated clay nanosheets in a polymer could carry along the in situ synthesized CNTs on their surfaces and potentially promote the CNT dispersion, and therefore, significantly improve mechanical properties of their polymeric nanocomposites. Clay has been used as the support for catalytic CVD growth of CNTs in a few studies, nonetheless, there has been no success in the synthesis of high quality CNTs[1-6,21]. Pillared interlayer clays (PILC) have been used as catalysts in numerous studies[2,22,23]. The main advantage of this type of material comes from the fact that a porosity can be controlled by incorporating several elements in between the layers of an expandable nanoclay. The formed porous PILC can be systematically controlled by increasing the size, the form, and the distance between nanolayers. PILC has been explored as catalyst support for the active phase forming the pillar[22,23]. Certain polynuclear species have been under attention because, after they undergo dehydroxylation and dehydration, they can give interesting catalytic properties. Therefore, the produced PILC as heterogeneous catalysts and catalytic supports can be very advantageous for synthesis of CNTs because the metal oxide pillars possessing remarkable porosity are obtained by separating the clay nanolayers using the pillaring organometallic agent. High molecular weight pillaring agents can establish wider channels than those with smaller molecular weight. The first Fe-PILC was reported by Berkheiser et al.[24] in 1977 and then by Traynor et al. in 1978[25]. However, their material showed a lack of thermal stability. In 1984, Yamanaka et al.[26] presented the first reference related to the preparation of Fe-PILC using an aqueous solution of $[Fe_3(OCOCH_3))_7OH.nH_2O]^+NO_3^-$, in which a cation exchange of partially hydrolyzed trinuclear iron acetate occurs with a Na+MMT. The PILC can be produced by introducing metal oxides into the interlayer spaces of swelling clays. The oxide acts as pillars to keep the silicate layers apart and form the interlayer cavities[27]. The pillars are thermally stable and give a high surface area to the clay substrate.

SUMMARY

In an aspect of the present disclosure, there is provided a nanomaterial, comprising a nanoclay, the nanoclay having a layered structure; and carbon nanotubes, the carbon nanotubes being intercalated between layers of the layered structure of the nanoclay.

In an embodiment of the present disclosure, there is provided a nanomaterial wherein the carbon nanotubes comprise an $I_D/I_G$ Raman intensity ratio or $A_D/A_G$ Raman area ratio that is less than 2. In another embodiment, there is provided a nanomaterial wherein the $I_D/I_G$ Raman intensity ratio or $A_D/A_G$ Raman area ratio is less than 1.5. In another embodiment, there is provided a nanomaterial wherein the $I_D/I_G$ Raman intensity ratio or $A_D/A_G$ Raman area ratio is less than 1. In another embodiment, there is provided a nanomaterial wherein the carbon nanotubes comprise an $I_G/I_G$ Raman intensity ratio that is about 0.2 to about 1.

In another embodiment, there is provided a nanomaterial wherein the carbon nanotubes comprise approximately 75% to approximately 90% $sp^2$ carbon bonding. In another embodiment, there is provided a nanomaterial wherein the carbon nanotubes comprise approximately 80% to approximately 90% $sp^2$ carbon bonding. In another embodiment, there is provided a nanomaterial wherein the carbon nanotubes comprise approximately 85% to approximately 90% $sp^2$ carbon bonding. In another embodiment, there is provided a nanomaterial wherein the carbon nanotubes comprise approximately ≥90% sp$^2$ carbon bonding.

In another embodiment, there is provided a nanomaterial wherein the carbon nanotubes have a high aspect ratio. In another embodiment, there is provided a nanomaterial wherein the high aspect ratio is about 300 to about 1000. In another embodiment, there is provided a nanomaterial wherein the carbon nanotubes comprise an open channel structure. In another embodiment, there is provided a nanomaterial wherein the carbon nanotubes comprise multiwall carbon nanotubes. In another embodiment, there is provided a nanomaterial wherein the multiwall carbon nanotubes comprise approximately 10-30 wall layers.

In another embodiment, there is provided a nanomaterial wherein the nanoclay has a cation exchange capacity of about 5 to about 8. In another embodiment, there is provided a nanomaterial wherein the carbon nanotubes are at a loading that is 0.5, 1, 2, 3, 4, 5, 6, 7, or 8 times the cation exchange capacity of the nanoclay. In another embodiment, there is provided a nanomaterial wherein the carbon nanotubes are at a loading that is 4, 5, 6, 7, or 8 times the cation exchange capacity of the nanoclay. In another embodiment, there is provided a nanomaterial wherein the carbon nanotubes are at a loading that is 6, 7, or 8 times the cation exchange capacity of the nanoclay.

In another embodiment, there is provided a nanomaterial wherein the nanoclay is a montmorillonite nanoclay, a bentonite nanoclay, a hectorite nanoclay, a saponite nanoclay, a halloysite nanoclay, a kaolin nanoclay, a laponite nanoclay, a vermiculite nanoclay, or a combination thereof.

In another embodiment, there is provided a nanomaterial wherein the nanomaterial has a powder conductivity of about 10$^{-8}$ S/cm to about 100 S/cm. In another embodiment, there is provided a nanomaterial wherein the nanomaterial has a high porosity as the 001 XRD reflection peaks of the catalyst and the CNTs diminishes significantly or disappears.

In another aspect of the present disclosure, there is provided a nanocomposite material comprising a polymer; and a nanomaterial as described herein, the nanomaterial being dispersed throughout the polymer.

In another embodiment of the present disclosure, there is provided a nanocomposite material wherein the nanocomposite material exhibits a percolation threshold at a nanomaterial concentration of about 0.1 wt % to about 2 wt %. In another embodiment, there is provided a nanocomposite material wherein the nanocomposite material exhibits an EMI shielding of about 8 to about 10. In another embodiment, there is provided a nanocomposite material wherein the nanocomposite material has a real permittivity of about 5 to about 20; or about 10. In another embodiment, there is provided a nanocomposite material wherein the nanocomposite material has an imaginary permittivity of about 0.5 to about 8. In another embodiment, there is provided a nanocomposite material wherein the nanocomposite material has a loss tangent that is less than 1; or less than 0.8; or less than 0.5. In another embodiment, there is provided a nanocomposite material wherein the nanocomposite material has a loss tangent that is about 0.06 to about 0.8.

In another embodiment, there is provided a nanocomposite material wherein the nanomaterial is at a concentration of about 0.5 wt % to about 5 wt %.

In another embodiment, there is provided a nanocomposite material wherein the polymer is a thermoplastic (e.g., polyethylene, polypropylene, etc.), engineering thermoplastic (e.g., polycarbonate, polymethylmethacrylate), elastomer (e.g., FKM, CR, NR, Silicon rubbers, etc.), thermoplastic elastomer (e.g., EPR, EPDM, SBR, etc.), thermoset material (e.g., epoxy, polyester, etc.), or a combination thereof.

In another aspect of the present disclosure, there is provided a method of making a nanomaterial, comprising providing a catalyst precursor, the catalyst precursor comprising a metal complex deposited on a nanoclay; forming a catalyst from the catalyst precursor, the catalyst comprising metal nanoparticles intercalated between layers of the nanoclay; and synthesizing carbon nanotubes in the presence of the catalyst to form a nanomaterial, the nanomaterial comprising the carbon nanotubes intercalated between the layers of the nanoclay.

In another embodiment of the present disclosure, there is provided a method wherein the metal complex is an organometallic complex. In another embodiment, there is provided a method wherein the organometallic complex comprises Fe, Ni, Co, Cu, Mo, alloys thereof, or hybrid catalyst mixtures thereof. In another embodiment, there is provided a method wherein the metal of the organometallic complex is singly, positively charged. In another embodiment, there is provided a method wherein the organometallic complex comprises acetate ligands. In some examples, the organometallic complex comprises ligands that coordinate to Fe and physically attach to the nanoclay surface. In another embodiment, there is provided a method wherein the organic metallic complex is [Fe$_3$(OCOCH$_3$)$_7$OH·2H$_2$O]$^+$NO$_3^-$].

In another embodiment, there is provided a method wherein forming the catalyst from the catalyst precursor comprises calcining the catalyst precursor to form an oxide of the catalyst precursor. In another embodiment, there is provided a method wherein calcining the catalyst precursor to form an oxide of the catalyst precursor comprises forming a pillared clay, wherein pillars of the oxide of the catalyst precursor are formed between the layers of the nanoclay. In another embodiment, there is provided a method wherein forming the catalyst from the catalyst precursor further comprises reducing the oxide of the catalyst precursor to form the catalyst. In another embodiment, there is provided a method wherein calcining the catalyst precursor comprises calcining under an approximate air flow rate of 100 sccm at approximately 300° C. for approximately 5 hours; or approximately 350° C. for approximately 4 hours; or approximately 400° C. for approximately 3 hours. In another embodiment, there is provided a method wherein reducing the oxide of the catalyst precursor comprises reducing the oxide of the catalyst precursor with H$_2$ at about 350° C. to about 450° C. for approximately 1 hour under an approximate flow rate of 100 sccm; or at about 300° C. for approximately 90 min, or at about 500° C. for approximately 45 min.

In another embodiment, there is provided a method wherein synthesizing carbon nanotubes in the presence of the catalyst comprises synthesizing the carbon nanotubes by chemical vapour deposition. In another embodiment, there is provided a method wherein synthesizing the carbon nanotubes by chemical vapour deposition comprises reacting a mixture of gases comprising a carbon source, H$_2$, and Ar in the presence of the catalyst. In another embodiment, there is provided a method wherein synthesizing the carbon nanotubes by chemical vapour deposition further comprises reacting the mixture of gases at about 600° C. to about 700° C.; or approximately 650° C. In another embodiment, there is provided a method wherein the mixture of gases are reacted in equal ratios. In another embodiment, there is provided a method wherein the mixture of gases are reacted at an approximate flow rate of about 50 sccm, or about 100 sccm, or about 200 sccm. In another embodiment, there is provided a method wherein the mixture of gases are reacted for approximately 4 hours. In another embodiment, there is provided a method wherein the carbon source is methane, ethane, acetylene.

In another embodiment, there is provided a method wherein synthesizing the carbon nanotubes by chemical vapour deposition further comprises reacting the mixture of gases in the presence of dopants. In another embodiment, there is provided a method wherein the dopants comprise a source of sulfur, ammonium, or nitrogen.

In another embodiment, there is provided a method wherein the carbon nanotubes are synthesized in a yield of about 50% to about 80%; or about 60% to about 80%; or about 65% to about 80%; or ≥80%. In another embodiment, there is provided a method wherein the nanoclay is a montmorillonite nanoclay, a bentonite nanoclay, a hectorite nanoclay, a saponite nanoclay, a halloysite nanoclay, a kaolin nanoclay, a laponite nanoclay, a vermiculite nanoclay, or a combination thereof.

BRIEF DESCRIPTION OF THE FIGURES

Embodiments of the present disclosure will now be described, by way of example only, with reference to the attached Figures.

DETAILED DESCRIPTION

General Definitions

Figure 1:
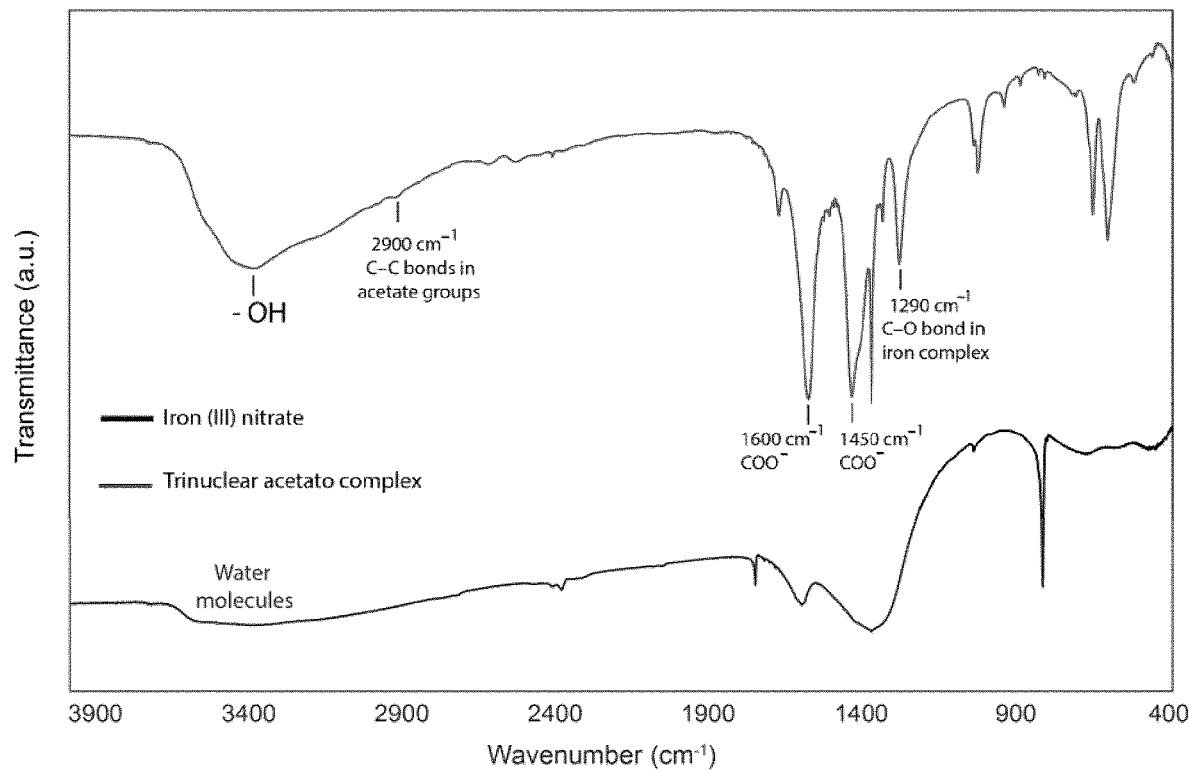
FIG. 1 depicts FTIR spectra of iron nitrate and trinuclear acetato complex.

'$A_D/A_G$' is a ratio of surface area of D-band peak to G-band peak in a Raman spectrum. Surface area of these peaks is measured by deconvolution of peaks in the Raman pattern and calculating the surface area. Higher $A_D/A_G$ shows a higher ratio of defects to the formed $sp^2$ (G-band) bonds in a synthesized carbon structure. The smaller the ratio is, the better the synthesized carbon structure is in terms of lower defects and higher amount of formed $sp^2$ bonds, both of which are considered to be favorable for a more conductive carbon nanotube (CNT(s)).

Cation exchange capacity (CEC), which herein is presented by "milliequivalent per 100 gram clay", represents a number of positive charges per 100 gram clay. A greater CEC shows that a clay possesses higher charges on its surfaces, and therefore, can react with larger amount of catalysts. CEC is usually given by a provider of the nanoclay, and can be measured by the amount of sodium or lithium ions that can saturate the surface of the nanoclay through an ionic interaction. As described herein, 5 to 8 times the CEC of the nanoclay was suitable to synthesize a high quality CNTs on clay nanolayers.

'G' peak' shows graphitization in synthesized materials. For example, in a Raman spectrum of a synthesized carbon nanotube, the G' peak shows that the carbon nanotube is multi-walled. In other words, it shows that a number of layered hexagonal $sp^2$ carbon layers have been synthesized on the top of each other. Generally, a higher value of $I_{G'}/I_G$ shows more hexagonal layers. As described herein, at 5 and 6 CECs of the catalyst, the G' peak starts to grow and its value increases by increasing the amount of the catalyst up to 8 CECs. Higher conductivity of the 8 CEC CNTs is due to formation of finer hexagonal carbon layers.

As used herein, percolation means that at least one conductive pathway for electrons is produced, and therefore, transforms a composite material from insulative to conductive. Percolation occurs at a concentration of the herein described nanomaterials (acting as a nanofiller) where this is a jump in electrical properties of the material. Percolation occurs at a short range of a filler's concentration, where the volume resistivity of the composite material suddenly decreases several orders of magnitude. In respect of the herein described nanocomposite materials, a low percolation threshold showed the effectiveness of the CNTs to form a conductive network at low concentrations of the herein described nanomaterial as a nanofiller. Percolation at low nanofiller concentrations leads to a cost-effective nanocomposite material. The herein described and synthesized CNTs showed a low percolation threshold proving the cost-effectiveness of the synthesized CNTs.

As used herein, 'aspect ratio' is the ratio of CNT length to diameter (L/D). At a higher aspect ratio, it is generally easier for CNTs to connect with each other and create a conductive network. For example, using percolation theory, it can be calculated that at an aspect ratio of L/D=1, a concentration of 16 vol % CNTs is required, whereas at an aspect ratio of L/D=1000, only 0.05 vol % concentration of CNTs is required. In addition, a higher aspect ratio of CNTs means that the herein described nanomaterials as a nanofiller will span more of a matrix, and therefore have better effectiveness in reinforcing said matrix. The herein described nanomaterials showed a high aspect ratio which is an important parameter in polymer reinforcement.

Electrical conductivity comes from the ordered movement of charges. The force on an electron is $-eE$ in presence of electric field, E, and the electron is accelerated in the opposite direction to the electric field because of the negative charge. The current density is:

$$J = N_e \cdot e \cdot \mu \cdot E$$

where J is current density, $N_e$ is number of electrons, is electron mobility, e is electron charge, and E is applied electric field. The applied electric field is the voltage over a sample's thickness. The electrical conductivity is defined as:

$$\sigma = \frac{J}{E}$$

where $\sigma$ is the electrical conductivity in Siemens per meter ($S \cdot m^{-1}$). Electrical conductivity is a property and usually is measured in a broad range. Conductivity of insulators is typically less than 10 $S \cdot m^{-1}$. Measurement procedure is relative, based on how a sample is molded for a conductivity measurement. As described herein, CNT powder was pressed to 10,000 pounds between two Teflon sheets and conductivity of this pellet of pressed powder was measured to determine powder conductivity of the sample. For comparison, the conductivity of a commercial CNT was measured with the same procedure. By comparing conductivity results of herein described CNTs with those of a commercial CNT, it was shown that the conductivity of the synthesized CNTs was greater than the commercial CNT, showing higher quality and lower defects of the synthesized CNTs. The herein described nanomaterial was considered to have a high porosity, as the 001 XRD reflection peaks of the catalyst and the CNTs diminished significantly or disappeared. Disappearance of the XRD 001 reflection peak of the nanoclay showed that the clay nanolayers were separated due to intercalation of a Fe catalyst inside interlayer spaces of the nanoclay, which increased the surface area of the catalyst and diffusivity of reactant gases for the synthesis of carbon nanotubes. This showed the effectiveness of the Fe catalyst for the synthesis of CNTs.

Electronic devices emit electromagnetic (EM) waves, and because these waves can interfere with the operation of other electronic devices, EMI shielding is required to dissipate a current of charges inside electronic devices. In respect of the herein described nanocomposite materials, an EMI shielding of about 8 to about 10 showed the effectiveness of the synthesized CNTs for EMI shielding applications.

Real permittivity shows how much energy from an external field is stored in a material. When an AC voltage, V, is applied to a dielectric material, two different electrical currents are induced: a conduction current which comes from free electrons and causes the electric loss (imaginary permittivity), and a displacement current which is due to charge polarization (real permittivity). Current, I, that flows through such a circuit in an alternating voltage is calculated as:

$$I = \frac{dQ}{dt} = \frac{d(CV)}{dt} = \omega C_0 (\varepsilon'' + i\varepsilon')V$$

where Q, t, $\omega$ and $C_0$ are stored charge, time, angular frequency and the capacitance of free space, respectively. Resistive current passes through a capacitor (leakage current), whereas capacitive current does not pass through the capacitor; but flows in the circuit to compensate for the charges stored on the surface of the capacitor.

$$I_C = \omega C_0 \varepsilon' V$$

$$I_R = \omega C_0 \varepsilon'' V$$

In respect of the nanocomposite materials described herein, a real permittivity of 5-20 in showed the capability of the nanocomposite material in charge storage applications.

Imaginary permittivity (dielectric loss) is part of the energy of an AC field which is dissipated into heat in a dielectric material. The dielectric loss is composed of Ohmic loss and polarization loss. Ohmic loss is due to DC conduction and shows dissipation of electrical energy by flow of charges. Dissipation by Ohmic loss weakens with frequency due to the shortened time for free electrons to sweep a network in alternating field cycles. Polarization loss in a dielectric material can involve interfacial, dipolar, and atomic losses. The polarized charges contribute to real permittivity as well by separation of positive and negative charges. A low amount of imaginary permittivity at low concentrations of the herein described nanomaterial as a nanofiller showed the potential of the herein described nanocomposite material for charge storage applications. By increasing the amount of the nanofiller, the imaginary permittivity increases (the nanocomposite materials became conductive) showing the effectiveness of the herein described nanomaterials as nanofiller for EMI shielding applications. As a comparison, the herein described nanocomposite materials formed of the herein described nanomaterials as a nanofiller, and nanocomposite materials of a commercial CNT were compared. At the same concentrations of CNTs, the real permittivity was greater for the herein described nanocomposite materials whereas the imaginary permittivity was lower. This showed the capability of the herein described nanomaterial as a nanofiller resulting in great di-electric properties.

Real and imaginary permittivity are ratioed using a dissipation factor ($\tan(\delta)$), which is considered important in industrial electronic devices. Low imaginary permittivity and high real permittivity lead to higher di-electric properties. Herein, $\tan(\delta)$ represents the di-electric behavior of the nanocomposite materials. When $\tan(\delta) \gg 1$, a material is a good conductor and when $\tan(\delta) \ll 1$, a material has good di-electric properties.

$$\tan(\delta) = \frac{\varepsilon''}{\varepsilon'} = \frac{I_R}{I_C} = \frac{\text{Energy dissipated/cycle}}{\text{Energy stored/cycle}}$$

The herein described nanocomposite material showed a loss tangent <1, showing good di-electric properties. Particularly, the $\tan(\delta)$ representing the di-electric behavior of the nanocomposite was about 0.06 to about 0.8, showing an acceptable di-electric behavior In respect of the herein described nanocomposite materials, a polymer includes, but is not limited to, a thermoplastic (e.g., polyethylene, polypropylene, etc.), an engineering thermoplastic (e.g., polycarbonate, polymethylmethacrylate, etc.), an elastomer (e.g., FKM, CR, NR, silicon rubbers, etc.), a thermoplastic elastomer (e.g., EPR, EPDM, SBR, etc.), a thermoset material (e.g., epoxy, polyester, etc.), or a combination thereof.

In some examples, the nanoclay is a montmorillonite nanoclay, a bentonite nanoclay, a hectorite nanoclay, a saponite nanoclay, a halloysite nanoclay, a kaolin nanoclay, a laponite nanoclay, a vermiculite nanoclay, or a combination thereof.

In an example of the present disclosure, the here described nanomaterials, or a nanomaterial made by the herein described methods is used as a nanofiller. In an example, the nanofiller is used for manufacturing automotive parts, such as but not limited to interior door parts, exterior body parts, or shock absorbents. In an example, the interior parts include plastic parts. In another example, the exterior parts include plastic parts or bumper parts. In another example, the nanofiller is used for manufacturing biomedical materials. For example, CNTs have been researched in drug delivery and biosensing fields for disease treatment, as they may be used for drug delivery and biosensing. For further example, functionalization of CNTs has been shown to increase solubility and allow for efficient drug delivery and tumor targeting. As the herein described CNTs were synthesized on clay, the solubility may increase due to the polarity of the clay substrate. In addition, clay is a natural material, and may have less side effects compared to other substrates, such as alumina. Further, as the nanoclay is hydrophilic, and as the CNTs intercalated therein is hydrophobic, the resulting nanomaterial may exhibit a dual behaviour, potentially making it more useful for biomedical applications In an example of the present disclosure, the here described nanomaterials, or a nanomaterial made by the herein described methods is used for charge storage. In another example, the here described nanomaterials, or a nanomaterial made by the herein described methods is used in a capacitor. In an example, the here described nanomaterials, or a nanomaterial made by the herein described methods is used in a battery.

In an example of the present disclosure, the here described nanomaterials, or a nanomaterial made by the herein described methods is used in polymer pipelines. The herein described CNTs may be applied in polymer pipelines, such as HDPE pipes. As the herein described CNTs are synthesized on the clay substrate, to form the herein described nanomaterials, they can disperse well inside a polymer matrix. The herein described nanomaterials act as reinforcements while the nanoclay layers may act as gas barriers, which is important in polymer pipeline industry. It was considered that this showed the synergism of the herein described nanomaterials in industrial applications. In another example, the here described nanomaterials, or a nanomaterial made by the herein described methods is used as a sensor. As the herein described nanomaterials can make a polymer conductive, if a leak or damage to a pipe occurs, the change or drop in conductivity may indicate the damaged section of the pipe, such that the herein described nanomaterials act as a sensor. As described herein, high conductivity of the herein described nanomaterials showed their effectiveness to act as reinforcement, gas barrier, and also sensor in polymer pipelines.

In an example where two different nanomaterials as described herein are acting as nanofillers, those nanofillers may result in a synergism in mechanical properties, such as stiffness, toughness, and impact. As such, in an example of the present disclosure, the here described nanomaterials, or a nanomaterial made by the herein described methods is used as a reinforcement material. In another example, the here described nanomaterials, or a nanomaterial made by the herein described methods is used as a gas barrier material. In an example, the here described nanomaterials, or a nanomaterial made by the herein described methods is used in aerospace materials.

In an example of the present disclosure, the here described nanocomposite materials are used for manufacturing automotive parts, such as but not limited to interior door parts, exterior body parts, or shock absorbents. In an example, the interior parts include plastic parts. In another example, the exterior parts include plastic parts or bumper parts. In another example, the automotive parts may include the automobile's main frame, bumpers, interior, or parts of the automobile's engine that need plastics with enhanced strength, stiffness, and toughness. In another example, the here described nanocomposite materials are used for manufacturing airplane parts, such as, but not limited to any plastic segments that need high strength, toughness, impact strength, and also electrical discharge.

In an example of the present disclosure, the here described nanocomposite materials are used for manufacturing biomedical materials.

In an example of the present disclosure, the here described nanocomposite materials are used for charge storage. In another example, the here described nanocomposite materials are used in a capacitor. In another example, the here described nanocomposite materials are used in a battery.

In an example of the present disclosure, there is provided a use of a pillared nanoclay for synthesizing carbon nanotubes, the pillared nanoclay having a layered structure; and the carbon nanotubes being synthesised between layers of the layered structure of the nanoclay. In another example, there is provided a use wherein the pillared nanoclay comprises pillars of an oxide of a catalyst precursor intercalated between the layers of the layered structure of the nanoclay. In another example, there is provided a use wherein the catalyst precursor comprises a metal complex deposited on a nanoclay. In another example, there is provided a use wherein the metal complex is an organometallic complex. In another example, there is provided a use wherein the organometallic complex comprises Fe, Ni, Co, alloys thereof, or hybrid catalyst mixtures thereof. In another example, there is provided a use wherein the metal of the organometallic complex is singly, positively charged. In another example, there is provided a use wherein the organometallic complex comprises acetate ligands. In another example, there is provided a use wherein the organic metallic complex is $[Fe_3(OCOCH_3)_7OH \cdot 2H_2O]^+NO_3^-]$. In another example, there is provided a use wherein the carbon nanotubes are synthesized by chemical vapour deposition, arc-discharge, or laser ablation. In another example, there is provided a use wherein the carbon nanotubes are synthesized in a yield of about 50% to about 80%; or about 60% to about 80%; or about 65% to about 80%; or ≥80%.

To gain a better understanding of the invention described herein, the following examples are set forth. It should be understood that these examples are for illustrative purposes only. Therefore, they should not limit the scope of this invention in anyway.

EXAMPLES

Example 1—Catalytic Synthesis of CNT on Fe-Supported Nanoclay: A Unique CNT-Clay Hybrid Nanofiller for High-Performance Polymer Nanocomposites A synthesis of multiwall carbon nanotubes (CNTs) on montmorillonite nanoclay was achieved through in situ catalytic chemical vapor deposition technique. The trinuclear Fe (III)-acetato complex precursor: $[Fe_3(OOCCH_3)_7 \cdot OH \cdot nH_2O]^+NO_3^-$, which was identified by chemical analysis and FTIR spectroscopy, was synthesized and then used as a catalyst precursor to perform the ion exchange reaction at different concentrations with the interlayer cations. The anion of the metal salt controlled the ion exchange reaction during metal deposition on clay surfaces, which affected the transition of the precursor to the metallic nanoparticles at the CNT synthesis step. The Fe-supported clay resulted in a $Fe_2O_3^-$ pillared clay after the calcination process. Clay-CNT hybrid nanofiller products with varying CNT content and quality were observed and investigated. The complex precursor proved to be an excellent catalyst for the growth of CNTs. The obtained CNT was studied using X-ray diffraction, thermal analysis, Raman, scanning electron microscopy, transmission electron microscopy, and measurements. The Raman spectroscopy showed that the intensity of D-band peak decreased with the amount of iron complex added, whereas G and G' bands increased up to 7 CEC of the complex concentration. The CNT yield increased at higher iron content, as the CNTs yield depended primarily on the amount of catalyst available to form the catalyst nanoparticles. X-ray diffraction results indicated that Na+MMT layers were intercalated with iron species during the ion-exchange processes and further delaminated due to the growth of CNTs. The 6, 7 and 8 CEC CNTs exhibited smaller diameter, 14.6 (±4.4), 18.2 (±4.4) and 16.5 (±6) of CNTs compared to those of 4 CEC and 5 CEC catalysts. Synthesizing CNT-MMT hybrid nanofillers may be very promising in terms of developing novel high performance nanomaterials especially for polymer-nanocomposite applications.

Herein described is a synthesis of clay-supported trinuclear iron acetate as a catalyst for the growth of CNTs followed by the synthesis of CNTs. The first part of this Example is directed towards the synthesis of the trinuclear iron acetate complex and the Fe-PILC with nanosize hematite ($\alpha$-$Fe_2O_3$ particles) that were prepared by thermal decomposition of the trinuclear acetato-hydroxo iron (III) nitrate complex. The Fe-PILC preparation procedure with detailed characterization of the physical and molecular structure was provided. Fourier transform infrared spectroscopy (FTIR), elemental analysis, X-ray diffraction (XRD), thermogravimetric analysis (TGA), and scanning electron microscopy (SEM) were applied to investigate the synthesized chemical structure. In the second part, the synthesized CNT was characterized using different techniques including transmission electron microscopy (TEM), SEM, X-ray diffraction (XRD), TGA, Raman spectroscopy, and compressed CNT powder conductivity measurement. Finally, an optimum concentration of the catalyst for the CNT synthesis will be elaborated in order to achieve clay-CNT combining a high quality and appropriate content of carbon nanotube.

EXPERIMENTAL

Materials

The nanoclay used was sodium montmorillonite (Na+ MMT) under the trade name of Cloisite® Na+ (with a cation-exchange capacity [CEC] of 92.6 milliequivalent/100 g clay) obtained from Southern Clay Product, USA. Starting material for catalyst preparation was the ferric nitrate salt of $Fe(NO_3)_3 \cdot 9H_2O$ (Aldrich, 98+%) as the catalyst precursor, ethanol (reagent grade), and acetic anhydride $(CH_3CO)_2O$ (ReagentPlus grade, ≥99%). All chemicals were reagent grade and were used without further purification.

Microchemical Analysis

Chemical analysis of the complex was determined by CHN elemental analysis. Number of acetate groups was calculated according to the carbon content determined by CHN microanalysis using a model 2400 Series II CHNS/O elemental analyzer.

Sample Preparation

Trinuclear acetato-hydroxo iron (III) nitrate complex $([Fe_3(OCOCH_3)_7OH \cdot 2H_2O]^+NO_3^-)$ was synthesized using the method reported by Yamanaka et al.[26]. The iron precursor for this preparation was $Fe(NO_3)_3 \cdot 9H_2O$. The $Fe(NO_3)_3 \cdot 9H_2O$ (40.4 g) was dissolved in ethyl alcohol, after which 70 mL of acetic anhydride was gradually added. When the reaction developed heat, the mixture was cooled in an ice bath. After that all of the acetic anhydride reacted, the resulting precipitate was separated by filtration. Some of the precipitate was purified with acetic acid and petroleum ether for microanalysis to confirm the structure as $[Fe_3(OCOCH_3)_7OH \cdot 2H_2O]^+NO_3^-$, in which the amounts of C, H, and N are theoretically calculated as C 23.16%, H 3.77%, and N 2.01%. The rest of the precipitate was combined with Na+MMT for the ion exchange reaction. Table 1 shows the elemental analysis carried out for the characterization of the iron complex.

TABLE 1

Elemental analyses of the Fe complex

| | Carbon % | Hydrogen % | Nitrogen % |
|---|---|---|---|
| Experimental | 23.52 | 3.90 | 1.92 |
| Theoretical | 23.16 | 3.77 | 2.01 |
| Yamanaka [28] | 23.49 | 3.93 | 1.97 |

$[Fe_3(CH_3COO)_7OH \cdot 2H_2O]^- NO_3^-$;

For preparation of the Fe-PILC catalyst, different portions of the trinuclear acetate complex, equivalent to 0.5, 1, 2, 3, 4, 5, 6, 7, and 8 times the CEC of Na+MMT, were added to a suspension of one gram of Na+MMT in water. The mixture was allowed to react under stirring at 40° C. for 24 hours. The complex was deposited onto the clay substrate through an ion exchange reaction with the sodium ions of the parent clay. Then, the MMT was filtered and washed with water several times. The catalyst was dried at room temperature for another 24 hours followed by two hours at 100° C. under vacuum. The resulting product was brown in color.

Synthesis of CNTs

Calcination was performed at 350° C. for 4 hours under a 100 sccm air flow rate (air, AI IND-K) to transform the trinuclear acetato complex precursor into its corresponding oxide. It was then ground and sieved. The ground catalyst was further reduced by using hydrogen (Praxair AM 5-K) flow with a flow rate of 100 sccm at 400° C. for one hour to obtain pure metallic iron nanoparticles on clay nanolayers.

The CNTs were synthesized by CVD method using a mixture of ethane ($C_2H_6$, Praxair ET 5.0RS-K, 99.999%), hydrogen ($H_2$, Ultra High purity grade, 99.999%, HY 5.0UH-K) and argon (AR 5.0UH-KN, Ultra High Purity Grade, 99.999%). The catalysts were placed inside a quartz boat which was then transferred into a quartz tubular reactor (inner and outer diameters of 40 mm and 46 mm, respectively) inside a furnace (Thermo Scientific-Lindberg Blue M). The synthesis was carried out at 650° C. for 4 hours. The flow rates of $C_2H_6$, $H_2$, and Ar were kept constant at 50 SCCM. The following formula was used to evaluate the carbon yield of the catalyst:

$$\text{Yield (\%)} = \frac{w_{100} - w_{800}}{w_{100}} \times 100 \qquad \text{Eq. (1)}$$

where $w_{100}$ and $w_{800}$ are the weight percentages of the material based on TGA results at 100 and 800° C., respectively.

Characterization

Fourier Transform Infrared Spectroscopy (FTIR)

FTIR spectroscopy was performed to investigate the structure of the synthesized iron complex using a Nicolet Nexus 470 FTIR spectrometer in transmittance mode. The test was carried out within the range of 4000-400 $cm^{-1}$ for 32 scans, with a spectral resolution of 2 $cm^{-1}$.

Raman Spectroscopy

Structural defects of the synthesized CNTs were inspected using Raman spectroscopy. Powder specimens of the synthesized CNTs were placed on a glass microscope slide for analysis. Raman spectra were recorded from 0 to 3700 $cm^{-1}$ on a Witec alpha 300 R Confocal Raman Microscope (WITec GmbH, Germany) using a 532 nm laser wavelength. Radiation from an argon-ion laser was used as the excitation source. The spectra were obtained by integrating the powder samples for 200 s with a laser power at the CNT powder. The listed values for D, G, and G' band intensities were obtained from a minimum of five different positions on the CNT powders. Intensities are averaged based on intensity measurements attained from base-lined Raman spectra that were deconvoluted using OriginPro software.

Thermogravimetric Analysis (TGA)

Ion exchange reaction between clay nanosheets and different concentrations of the trinuclear acetato complex (equivalent to 0.5, 1, 2, 3, 4, 5, 6, 7, and 8 times the CEC of Na+MMT) was investigated through TGA (TA instruments—Q500, New Castle, USA) under air medium. Additionally, the thermal stability and the yield of the synthesis process of CNTs were examined by TGA. The samples were heated from room temperature to 900° C. at a rate of 10° C./min with air atmosphere.

X-Ray Photoelectron Spectroscopy (XPS)

XPS spectra were obtained using a Thermofisher Scientific K-Alpha XPS spectrometer (Thermofisher Scientific, E. Grinstead, UK). Monochromatic AI Kα X-rays were used with a 400 μm nominal spot size diameter. A combined e/Ar+ flood gun was used for Charge compensation. For all samples, a survey spectrum was obtained with a low energy resolution (pass energy—150 eV), where only C and O were detected. Then, high resolution (pass energy—25 eV) spectra were acquired for both C1s and O1s regions. Peak fitting was conducted on these areas with a combination of 30%-70% Lorentzian-Gaussian. Relative atomic % were obtained from the peaks employing the sensitivity factors provided by the instrument (C1s—1; O1s—2.881). All instrument operation and data processing were carried out using the Avantage v. 5.962 software.

X-Ray Diffraction (XRD)

XRD analysis was performed using a Rigaku ULTIMA III X-ray diffractometer, with Cu K-alpha radiation as the X-ray source. Scans were performed in the range of 0.9 to 90 degrees of 2-theta using a 0.05-degree step and a counting time of 2.0 degrees per minute, operating at 40 kV and 44 mA.

Scanning Electron Microscopy (SEM)

Morphologies of reduced iron catalysts and also clay-CNTs were observed by scanning electron microscopy (SEM) on a Quanta™ 250 FEG. Sputter Coating was performed using a Hummer I Gold-Paladium (80/20) and Pt targets.

Transmission Electron Microscopy (TEM)

Synthesized CNTs were dispersed into ethyl alcohol. An eye dropper was used to place one drop of the dispersion on a copper grid, which was then dried with air. The TEM analysis was then carried out on a Tecnai TF20 G2 FEG-TEM (FEI, Hillsboro, Oreg., USA) at a 200 kV acceleration voltage with a standard single-tilt holder. Images were captured with a Gatan UltraScan 4000 CCD (Gatan, Pleasanton, Calif., USA) at 2048×2048 pixels. Diameter of CNTs was measured for more than 50 individual CNTs using the MeasureIT software (Olympus Soft Imaging Solutions GmbH).

Conductivity of CNT Powder

Electrical conductivity of CNT powders was measured using a Loresta GP conductivity meter (MCP-T610 model, Mitsubishi Chemical Co., Japan) connected with a four-point probe. The CNT samples were placed into a mold with dimensions of 22.9×10.2×1.1 $mm^3$ followed by compression molding at 6000 psi, and then held for about five minutes. Reported conductivities and error bars are the average and the standard deviation of six conductivity measurements for each CNT sample.

Composite Preparation

Poly (methyl methacrylate) [PMMA] was provided by Arkema Inc. (Plexiglas VM-100). MWCNT, Nanocyl™ NC7000™, was purchased from Nanocyl S.A. (Sambreville, Belgium), having an average length of 1.5 μm and average diameter of 9.5 nm. Two nanocomposite systems, PMMA/CNT-clay and PMMA/NC7000™ composites were produced with CNT concentrations of 0.5, 1, 2, and 3 wt. % by melt mixing in a Haake Rheomix series 600 OS internal batch mixer. Prior to mixing, the raw materials were dried in a vacuum oven at 60° C. overnight. Compounding was performed at 150 rpm for 20 min at 220° C.

Dielectric and Electromagnetic Interference (EMI) Shielding

EMI shielding was measured within the X-band frequency range (8.2-12.4 GHz) using an E5071C network analyzer (ENA series 300 KHz-20 GHz). Samples were placed between two lines of the network analyzer on a waveguide mode. Analyzer sent a wave signal to the sample. Scattering parameters (S-parameters) of each sample were, then, recorded to calculate EMI shielding effectiveness, which is a logarithmic ratio of the incident power to the transmitted power. The S-parameters of each sample were converted to the dielectric properties using the Reflection/Transmission Mu and Epsilon Nicolson-Ross method.

Results and Discussion

Fe-PILC Catalyst

FTIR

Structure of the synthesized pillaring complex was investigated using the Fourier transform infrared (FTIR) technique. FIG. 1 shows the FTIR spectra of the iron nitrate precursor and the synthesized Fe-complex, to identify the synthesized iron complex. The complex spectrum showed a band at ~1685 $cm^{-1}$ assigned to the N=O double bond of the nitrate. In the iron complex spectrum, the two intense bands at ~1600 $cm^{-1}$ and ~1450 $cm^{-1}$ were due to the symmetric and asymmetric stretching of the $COO^-$ ion, respectively. The small band at ~1385 $cm^{-1}$ was attributed to the symmetric deformation of the $CH_3$ groups. The signals at ~1290 $cm^{-1}$ and ~1035 $cm^{-1}$ were attributable to the C—O bond in the iron complex spectrum, confirming the presence of acetate groups in the structure of the synthesized salt[25].

Ion Exchange Reaction

Figure 2:
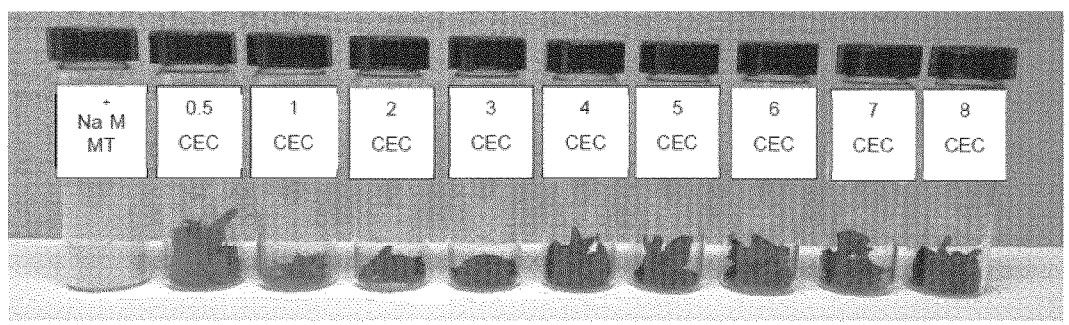
FIG. 2 depicts catalyst clay samples with loadings of 0.5, 1, 2, 3, 4, 5, 6, 7, and 8 CECs of trinuclear acetato complex.

The basic phenomenon in the preparation of PILC is the ion exchange of inter-lamellar cations with large cationic species, which act as spacers to keep the layered structure open. A stable structure is achieved by accurate dehydration, transforming the hydroxides to stable oxide. Polynuclear metal species result in greater free interlayer spaces, which maintain a reasonable thermal stability and porosity[22,24-26,29,30]. The ion exchange reaction was carried out for different concentrations of trinuclear acetato complex. It was considered that the change in color could provide a rough criterion for the cation exchange reaction between $[Fe_3(OCOCH_3)_7OH \cdot 2H_2O]^+$ and $Na^+$ on the internal and external surfaces of the clay nanolayers. FIG. 2 shows that the color of pristine Na+MMT was white, whereas MMT ($Fe^{3+}$) with increasing the CEC ratios of $[Fe^{3+}]$/[clay] appeared to be darker brown. This darker color was attributed to iron contents physisorbed on the nanosheets. The MMT (4, 5, 6, 7, and 8 CECs of $Fe^{3+}$) was dark brown, which was attributed to the high contents of Fe-complexes on the MMT surfaces.

Thermogravimetric Analysis

Figure 3:
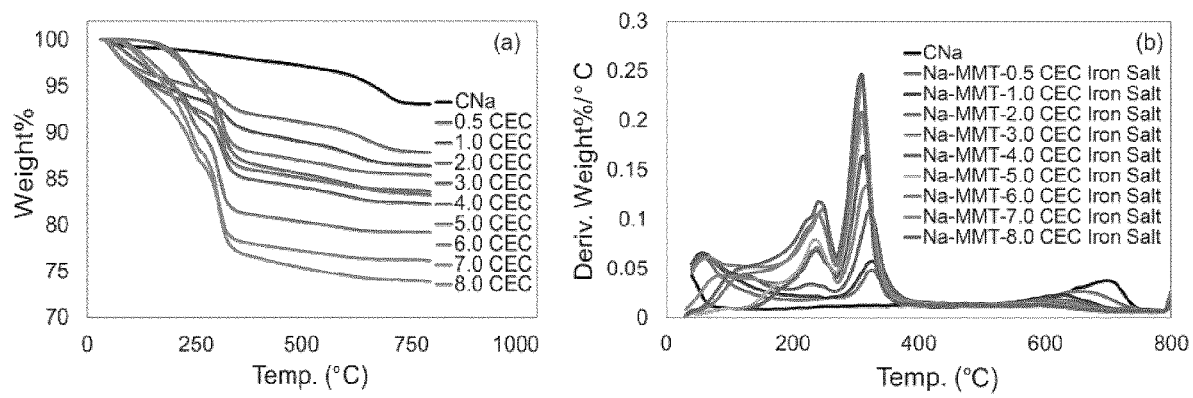
FIG. 3 depicts (a) TGA and (b) DTGA thermograms of $Na^+MMT$/iron complex with an air atmosphere.

Thermogravimetric analysis (TGA) confirmed the exchange reaction of the iron complex with the surface of the nanolayers (FIG. 3). Mass loss increased with greater amounts of trinuclear acetato complex that was used for the ion exchange reaction. However, by increasing the iron complex concentration from 7 to 8 CEC, the mass loss did not change (~23.1% and ~22.9% mass loss for 7 and 8 CECs, respectively, between 100-800° C.) showing the saturation of nanolayer surfaces [FIG. 3(a)]. DTG curves of Fe-PILC at different CECs showed the regional decomposition peaks for various trinuclear acetato complex concentrations (FIG. 3(b)). Two regions in the mass loss above 100° C. could be distinguished: (1) a peak at 100-250° C., which was due to loss of structural water and $NO_3$; and (2) an intense peak in the range 270-400° C., associated with the decomposition of the trinuclear acetato complex interlayers and the removal of acetyl groups. The second region was followed by the formation of $\alpha$-$Fe_2O_3$. The last peak at ~600° C. could be interpreted in terms of the crystallization of $\alpha$-$Fe_2O_3$ on the surface of the nanolayers, and also the dehydroxylation of the MMT layers, which typically occurs at ~600° C.-700° C.[25]. The broad peak below 100° C. was attributed to desorption and evaporation of the physisorbed water solvent.

X-Ray Diffraction (XRD)

Figure 4:
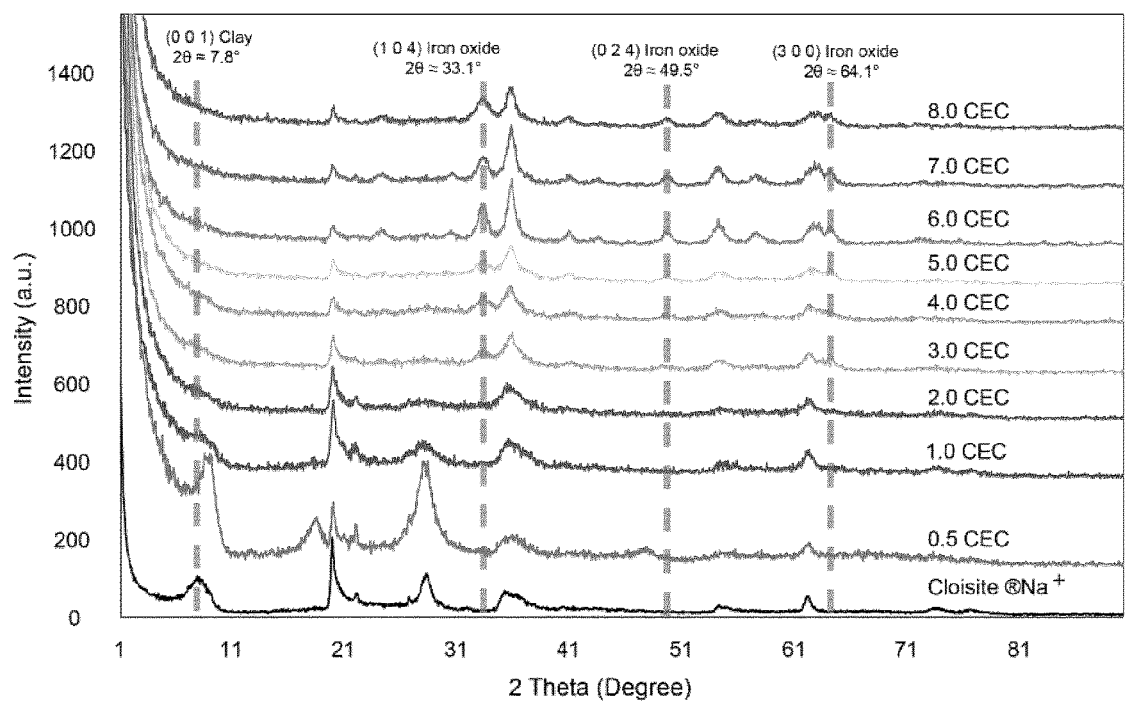
FIG. 4 depicts XRD diffractograms of $Na^+MMT$ after the calcination process with different concentrations of iron complex; curves were shifted vertically for clarity.

FIG. 4 shows the XRD patterns for the hematite pillars at different loadings of iron complex after the calcination process. The peak at ~7.8° in Na+MMT was the [001] reflection of the nanoclay. The [001] reflection existed in 0.5 CEC and 1 CEC PILCs. However, there were small shifts of [001] reflection to higher 2θ angles for 0.5 CEC (~8.9°) and 1 CEC (~8.5°) Fe-PILCs compared to that of neat Cloisite® Na+ (7.8°). It was considered that this may be due to the low amount of $\alpha$-$Fe_2O_3$ pillars after the calcination process, which, in turn, leads to a slight contraction of the interlayer spaces compared to those of pristine Na+MMTs. Nevertheless, the [001] peak disappeared in the Fe-PILC spectra above 1 CEC complex concentrations. The average crystalline domain size (in nm) of the $\alpha$-$Fe_2O_3$ at the [110] reflection (2θ≈33.1°) was calculated using the Scherrer equation, with the results presented in Table 2.

TABLE 2

Catalyst codes, mass loss, and crystalline domain sizes of different pillars

| Sample (CEC) | Iron salt amount (wt. %) (mass loss [150° C.-400° C.])* | $\alpha$-$Fe_2O_3$ (Hematite) crystalline domain size (nm) calcined at 350° C. (2Theta = 33.1°) ** |
|---|---|---|
| 0.5 | 5.43 | — |
| 1 | 7.01 | — |
| 2 | 10.51 | — |
| 3 | 13.45 | 5 ± 2 |
| 4 | 12.29 | 6 ± 2 |
| 5 | 14.19 | 6 ± 2 |
| 6 | 18.40 | 9 ± 2 |
| 7 | 20.52 | 8 ± 2 |
| 8 | 21.19 | 6 ± 2 |

*Calculated from TGA
**Calculated from X-ray diffraction

Figure 5:
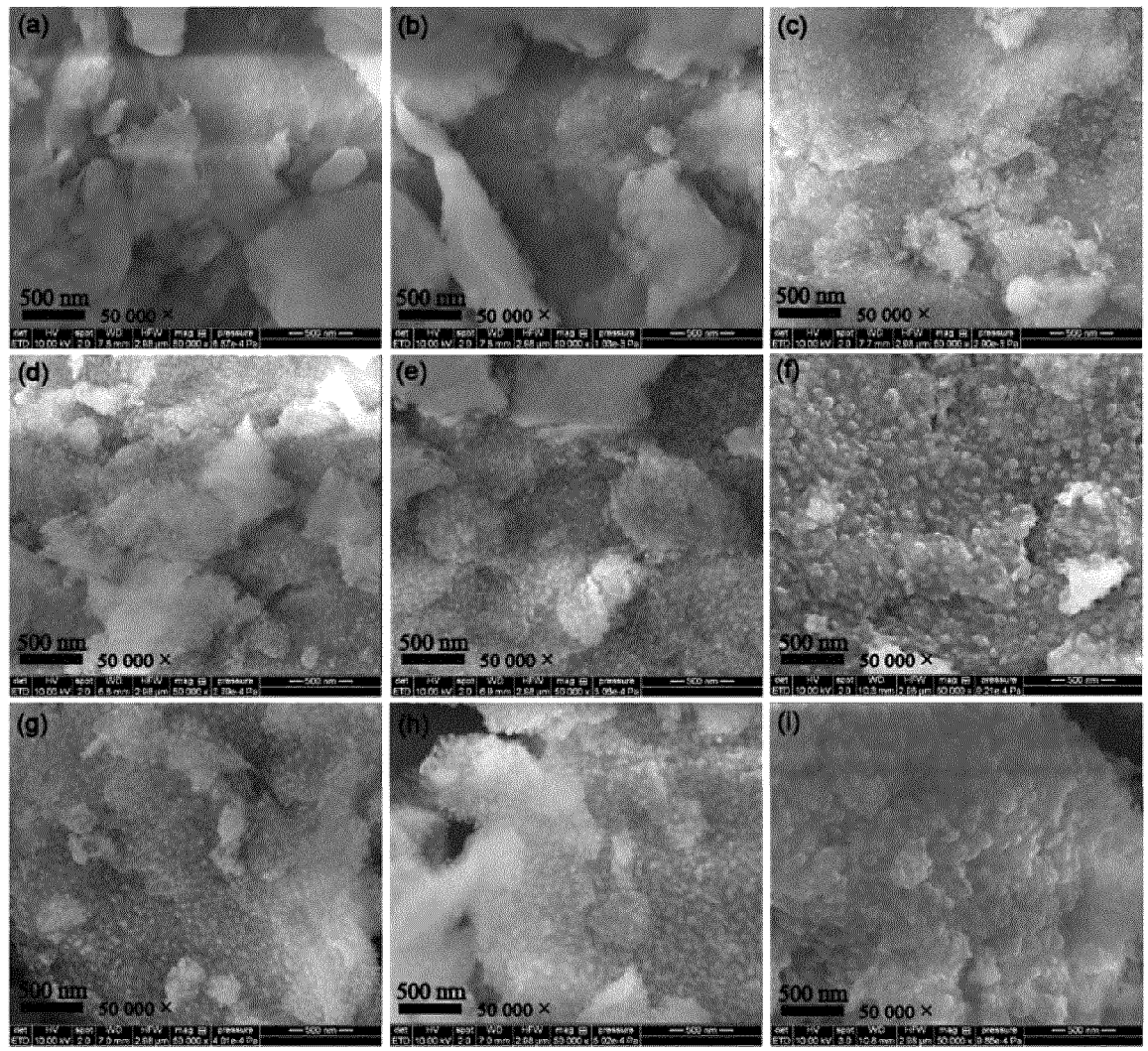
FIG. 5 depicts SEM image of Fe nanoparticles on clay substrate after reduction using different iron complex concentrations a) 0.5, b) 1, c) 2, d) 3, e) 4, f) 5, g) 6, h) 7, and i) 8 CECs: showing iron nanoparticles with the size range of 5-50 nm on the surface of the clay nanolayers.

For the 0.5, 1, and 2 CEC Fe-PILCs, the crystalline domain size was not detectable, due to the low amounts of iron oxide. The crystalline average domain size varied from 5 (±2) to 9 (±2) nm, by increasing the amount of iron salt from 3 to 8 CECs. The highest crystalline domain size was for 6 CEC catalyst (9±2 nm). SEM was used to achieve a better view of nanoparticle sizes at different complex concentrations after the calcination, followed by the reduction of the catalysts (FIG. 5). For that, the Fe-supported nanoclays were calcined at 350° C. for 4 hours, and subsequently, were reduced up to the 650° C. for 10 minutes with the flow of hydrogen.

SEM observations revealed very low quantities of iron nanoparticles for 0.5 and 1 CECs of the catalysts. Large quantities of nanoparticles (ranges 5-50 nm) existed in all samples after using the 2 CEC of the complex. The 2 CEC reduced catalyst presented very small nanoparticles after the reduction process. The nanoparticles grew bigger by increasing the amount of the iron complex up to 5 CEC, however, a slight reduction in the size of the metallic nanoparticles was observed from 5 CEC to 6 CEC. The nanoparticles had larger sizes in 7 and 8 CECs, compared to those of the 6 CEC, which may be explained by the sintering of the Fe metal at larger complex concentrations.

Carbon Nanotubes (CNT)

Raman Spectroscopy

Figure 6:
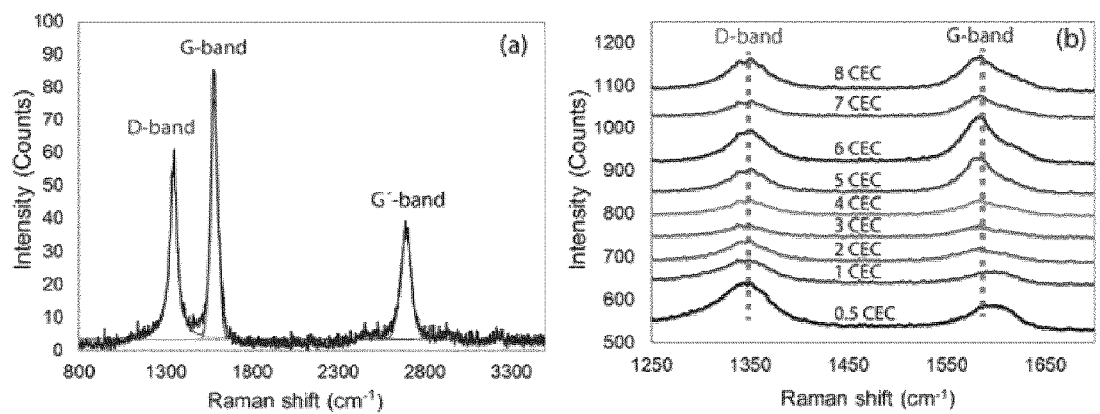
FIG. 6 depicts (a) Raman spectroscopy of CNT-clay prepared with 7 CECs of Fe complex; (b) Raman spectra of all samples in the Raman shift range of 1250 $cm^{-1}$-1700 $cm^{-1}$.

Raman spectroscopy was used to analyze the various features of CNTs. The tangential mode (G-band), defect-active mode (D-band), and G'-band in the Raman spectra of CNTs provide valuable information about structural defects[12,20,31,32]. The G-band (~1600 cm-1) was due to the stretching of C—C bond in graphitic materials, and is common to all $sp^2$ carbon forms. The D-band (~1400 cm-1) was due to lattice distortion that breaks the basic symmetry of the graphitic structure. The D-band was observed around 1350 $cm^{-1}$ and may be attributed to the disorders-defects in the structure of CNTs, as well as the presence of other types of carbons that ruin the symmetry of crystalline CNTs (FIG. 6). The presence of structural defects (e.g., pentagon-heptagon pairs, vacancies, heteroatoms, and impurities) activates the D-band feature. The G'-band (~2700 cm-1) was not associated with structural defects, and it is believed to originate from the electronic properties of the graphitic structure.

Table 3 shows the ID/IG ratio of CNTs synthesized at different CECs of the iron salt.

TABLE 3

Raman intensity ratios of $I_D/I_G$ and $I_{G'}/I_G$ bands for synthesized CNTs

| Sample | $I_D/I_G$ | $I_{G'}/I_G$ | $I_{G'}$ |
|---|---|---|---|
| 0.5 CEC | 1.93 | 0.054 | 2.94 |
| 1.0 CEC | 1.99 | 0.088 | 2.4 |
| 2.0 CEC | 1.77 | 0.344 | 9.13 |
| 3.0 CEC | 1.24 | 0.438 | 9.00 |
| 4.0 CEC | 1.14 | 0.438 | 13.16 |
| 5.0 CEC | 0.75 | 0.439 | 31.66 |
| 6.0 CEC | 0.72 | 0.457 | 42.63 |
| 7.0 CEC | 0.77 | 0.476 | 20.36 |
| 8.0 CEC | 0.94 | 0.397 | 27.17 |

CNTs synthesized with 0.5, 1, and 2 CEC of catalyst showed the highest ID/IG ratio representing the most defective structure. Lower ID/IG of CNTs synthesized with 5, 6, and 7 CECs of the catalyst compared to lower concentrations could be correlated to lower amount of iron salt, which are suggested to be the main contributors to the formation of the iron nanoparticles for the growth of CNT[23,31,33]. The IG'/IG ratios of synthesized CNTs increased with increasing the amount of iron salt up to 7 CECs. The difference in IG'/IG ratio was due to dissimilarities in the electronic properties of CNTs showing the important influence of catalyst on the electronic properties of CNTs[34]. Researchers reported a direct relationship between the metallicity of CNTs and IG'/IG ratio, and claimed that IG'/IG ratio can be considered as a criterion for the metallicity of CNTs[35,36]. These results concurred with SEM and TEM images of CNTs synthesized at different CECs, which showed different graphitic structure for different CECs of the catalysts. A direct relationship was observed between the amount of Fe salt concentration and ID/IG ratio, showing the effect of iron salt concentration on the formation of graphitic structure of CNTs. Lower ID/IG ratio of CNTs synthesized 6 or 7 catalyst compared to lower concentrations of catalysts could be correlated to lower amount of other carbon species.

Thermogravimetric Analysis (TGA)

Figure 7:
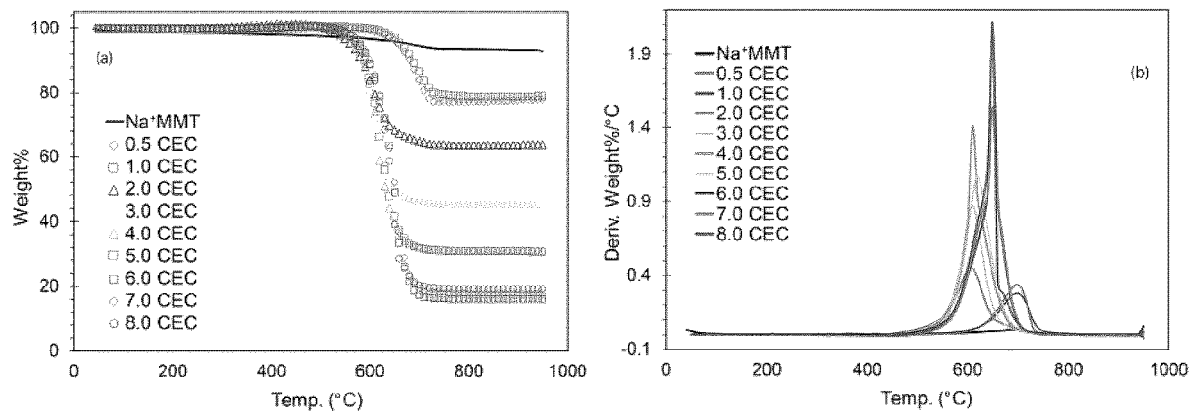
FIG. 7 depicts (a) TGA, and (b) first derivative TGA (DTG) curves of clay/CNT synthesized at different CECs of trinuclear acetato complex.
Figure 8:
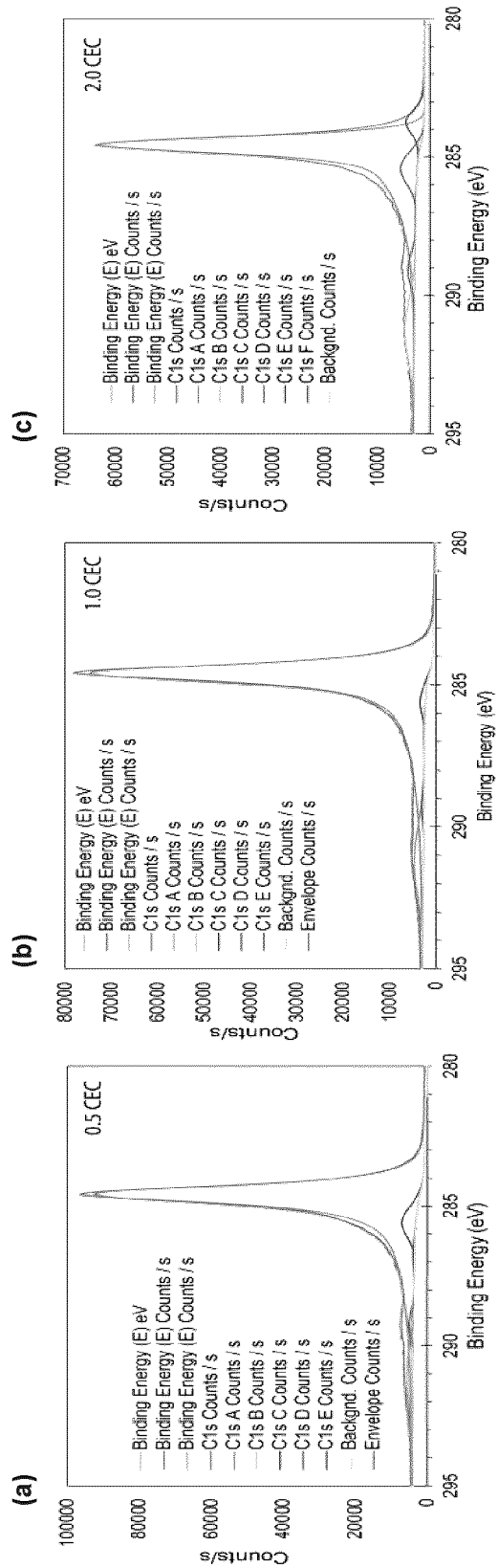
FIG. 8 depicts C1s core level XPS spectra for CNTs synthesized at different iron complex concentrations (a) 0.5 CEC, (b) 1.0 CEC, (c) 2.0 CEC, (d) 3.0 CEC, (e) 4.0 CEC (f) 5.0 CEC, (g) 6.0 CEC, (h) 7.0 CEC, (i) 8.0 CEC.

TGA provided valuable information about thermal stability and synthesis yield (FIG. 7). For all CNT materials, one major mass-loss event occurred from 22% for 0.5 CEC to 84% for 7 CEC (FIG. 7a). The remaining residues, i.e., clay substrate and metallic oxide particles was 19.2% for clay-CNT with 6 CEC of the catalyst. Because process yield is inversely proportional to the remaining residue, it can be stated that 6, 7 and 8 CECs were superior to the rest of the samples, in terms of the synthesis yield. Additionally, the inflection points of clay-CNT with 6, 7 and 8 were measured as 650° C. (FIG. 7), which was a little higher compared to the other CECs. The highest inflection point correlated with the least defective structure, as shown by the Raman results (FIG. 6). The mass loss increased with increasing the concentration up to 8 CECs of the iron catalyst. Increasing the iron concentration led to a higher crystallinity of the graphitic structure of CNTs, with a lower concentration of defects in the CNT structure. Presence of defects in the structure can initiate oxidation at lower temperatures. For 0.5 and 1 CECs of the catalyst, the mass loss occurs at 650° C., which was due to the dehydroxylation of the nanosilicates.

The DTG curve (FIG. 7(b)) can be applied to determine the oxidation temperature of CNTs as well as exploring the mass loss as single or multiple decomposition stages (e.g., double or shoulder peaks). The primary oxidation temperature, or inflection temperature, was at the largest peak on the weight derivative curve, and could represent the thermal stability of the material. The oxidation temperatures for 0.5, 1, 2, 3, 4, 5, 6, 7, and 8 CEC CNTs were ~700° C., ~700° C., ~610° C., ~610° C., ~610° C., ~620° C., ~650° C., ~650° C., and ~650° C., respectively. The 2 CEC CNT exhibited the lowest oxidation temperature, which may indicate the presence of other types of carbons, very thin CNTs, or a defective structure that decomposes at lower temperatures than those for structured carbons (e.g., SWCNT and MWCNT). The 6, 7, and 8 CECs had a major peak with a shoulder in the derivative curve (shoulder at ~620° C.) as well as the major oxidation temperature of 650° C., indicative of mostly CNTs with some other types of carbons. The 3 and 4 CECs exhibited fairly broad decomposition peaks, showing that the material had different carbon species (e.g., single-walled CNTs or amorphous carbon). The higher temperature shoulder in 8 CEC indicated that MWCNTs or other carbon structures may be present, as these CNTs decompose at higher temperatures compared to those for SWCNTs. The DTG curves showed that thermal decomposition increased after using 2 CEC catalyst. CNTs synthesized with 6, 7, and 8 CEC had higher thermal stability with narrower decomposition peaks, mainly due to less defective structure, and more homogenous CNTs with superior quality. It was considered that the inferior structural defects at low CECs were due to low catalyst concentration, whereas increasing defects at high catalyst amount (e.g., 8 CEC) may be explained by the sintering of catalyst nanoparticles. FIG. 7(b) shows that 0.5 or 1 CEC CNTs depict a peak at ~700° C. This may mainly be due to the decomposition of thick synthesized carbon nanofibers, and also dehydroxylation of the hydroxyl groups that were not covered by the catalyst precursors in the ion exchange process.

XPS analysis was performed to gain more insight on the structure of synthesized CNTs as complied in Table 5 and FIG. 6. The percentages of sp[1] [at ~283.66 BE (eV)], sp[2] [at ~284.58 BE (eV)], and sp[3] [at ~285.41 BE (eV)] showed presence of different types of carbon inside the structure of CNTs. The XPS revealed that ~80% of carbon bonding in CNTs molecular structure was sp[2], denoting a highly graphitic structure. The presence of the significant amount of sp[2] structure may stand for the electrical conductivity of synthesized CNTs, which also showed the effectiveness of the synthesized CNTs towards electrical conductivity and EMI shielding in their polymeric nanocomposites. The presence of oxygen, which can be in the forms of C—O, C═O, and O═C—O bonding (at ~287.45, ~289.49, ~291.36, and ~293.65 BE [eV]) in the molecular structure of CNTs may be due to the existence of a small amount of impurities during the synthesis course. The electrical conductivity of compressed CNT powders was measured and compiled in Table 5.

TABLE 5

Thermal and molecular properties, and compressed powder conductivities of CNTs

| Sample | 0.5 CEC | 1.0 CEC | 2.0 CEC | 3.0 CEC | 4.0 CEC | 5.0 CEC | 6.0 CEC | 7.0 CEC | 8.0 CEC |
|---|---|---|---|---|---|---|---|---|---|
| Inflection Point (° C.) | 700 | 700 | 610 | 610 | 610 | 620 | 650 | 650 | 650 |
| Onset point (° C.) | 650 | 649 | 540 | 548 | 550 | 560 | 560 | 570 | 568 |
| Synthesis yield (%) | 22.9 | 22.1 | 36.5 | 54.7 | 68.6 | 69.1 | 83.8 | 82.3 | 80.7 |
| sp[1] Carbon (at. %) | 3.41 | 5.50 | 5.13 | 4.86 | 4.42 | 4.09 | 4.23 | 4.03 | 4.15 |
| sp$^2$ Carbon (at. %) | 77.80 | 81.04 | 88.88 | 90.45 | 91.02 | 86.05 | 87.32 | 89.48 | 90.61 |
| sp$^3$ Carbon (at. %) | 10.27 | 3.49 | 5.70 | 2.27 | 0.0 | 1.16 | 6.03 | 4.09 | 1.07 |
| Powder Conductivity (S·m$^{-1}$) | 0 | 0 | 0 | 0.19 | 1.15 | 1.17 | 2.14 | 2.2 | 3.5 |

[1]CO bonding includes C—O, C=O and O=C—O bonds

The powders were insulative up to two CECs, however, powder the conductivity showed ascending trend with CEC, due to increase in the density of the synthesized CNTs at higher iron concentrations. For instance, at 6, 7, and 8 CECs, the CNTs showed powder conductivities of 2.1, 2.2, and 3.5 S·cm$^{-1}$, respectively. The ascending trend of powder conductivity with the iron concentration can be related to superior crystalline and less defective CNTs and also highly graphitic structure formed at high concentrations. For comparison, the conductivity of commercial NC7000™ CNT was measured as 1.83 S·cm$^{-1}$.

XRD

Figure 9:
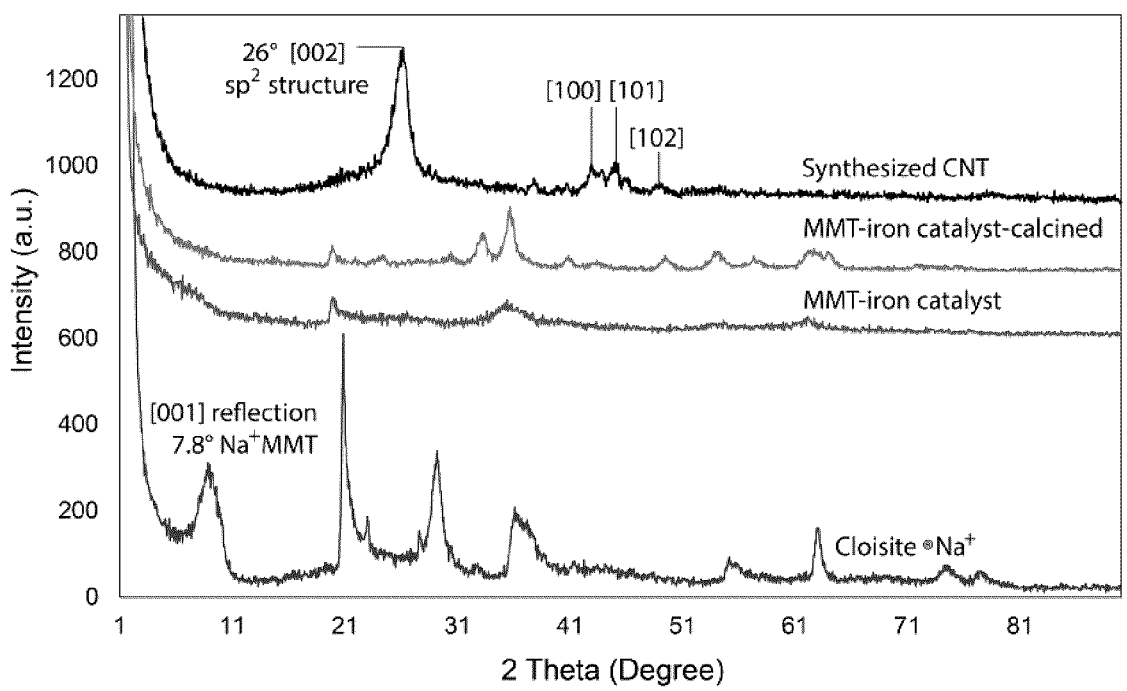
FIG. 9 depicts X-ray diffraction patterns of a) Na–MMT; (b) clay/Fe catalyst; (c) clay/Fe calcined, and (d) clay/CNT for 7 CEC catalyst.

XRD was used in order to determine the quality and crystalline structure of CNTs. FIG. 9 showed the X-ray diffraction pattern of the clay, clay-iron catalyst before and after calcination (hematite), and MWCNTs for 7 CEC catalyst. The pattern showed an intense peak at 2θ≈26° corresponding to the (002) reflection. Compared to normal peak in graphite at 2θ≈26.5°, the peak in the synthesized CNTs showed a small shift to lower 2θ, which was due to an increase in spacing between the sp2 graphitized layers[1]. The other diffraction peaks were at 2θ angles of 42.9°, 45°, and 49.9° were indexed to (100), (101), and (102) reflections. The crystalline domain size of the α-Fe$_2$O$_3$ was measured as 8±2 nm, whereas the domain size of the metallic iron particles in CNT-clay sample was measured as 14±7 nm (2θ≈44.7° or 65.1°), which may be attributed to the reduction state and sintering of the iron catalyst to form larger iron catalyst domains.

Scanning Electron Microscopy (SEM)

Figure 10:
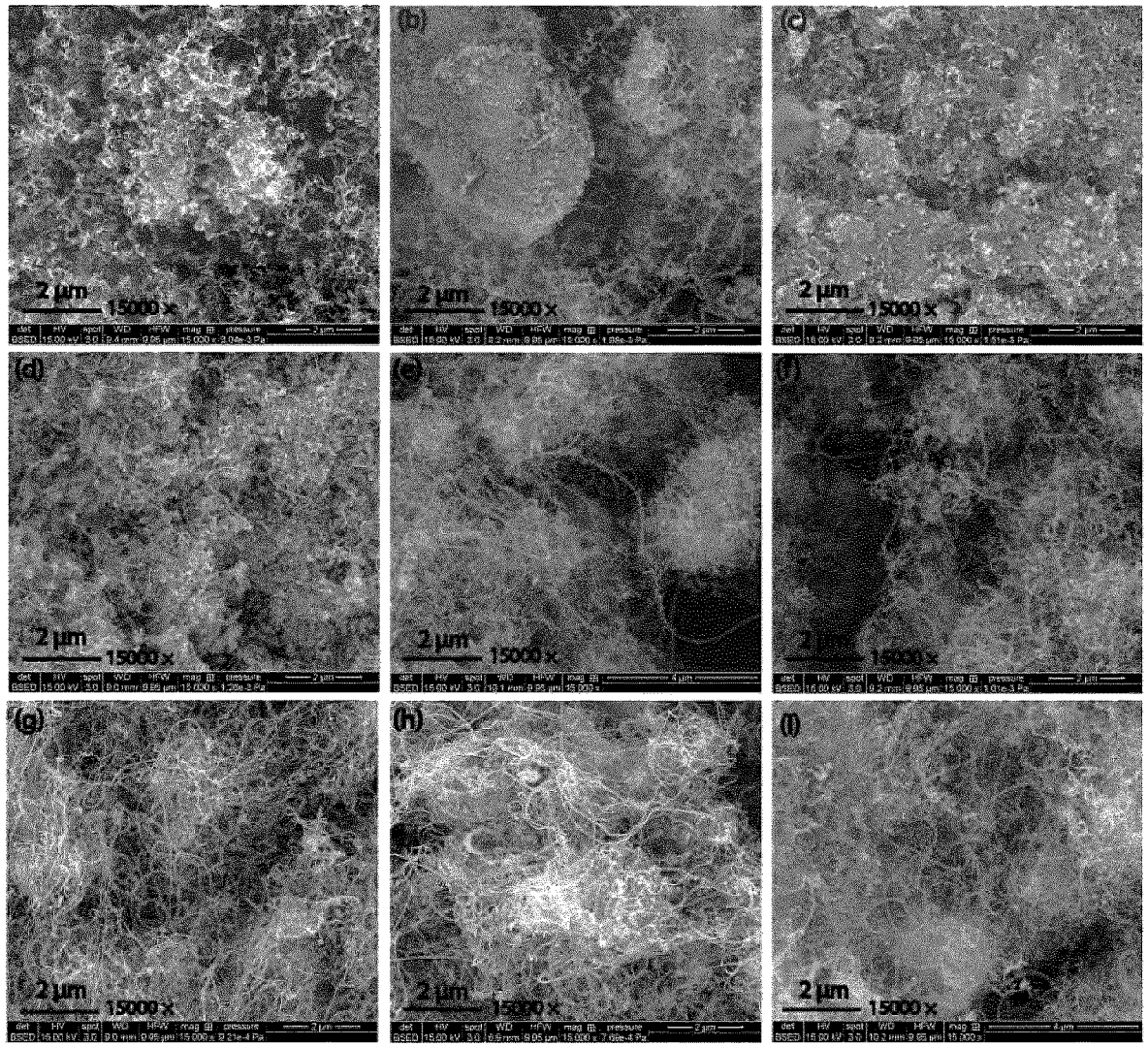
FIG. 10 depicts SEMs of grown powders of synthesized CNTs on nanoclay by thermal CVD at various CECs of trinuclear acetato complex: a) 0.5, b) 1, c) 2, d) 3, e) 4, f) 5, g) 6, h) 7 and i) 8 CEC [C2H6 (⅓ vol %), $H_2$ (⅓ vol %) and Ar (⅓ vol %) at 650° C.].

Morphologies of the synthesized clay-CNTs were examined by SEM and TEM. FIG. 10 shows the SEM images of CNTs formed over the silicate layers at various iron catalyst concentrations. As the catalyst concentration increased, the selectivity towards synthesis of CNTs increased. At lower concentrations, the carbon deposits were mostly thick fibers or thick CNTs in small quantity (FIGS. 10[a,b]). However, when the catalyst concentration exceeded 3 CECs, the crystalline carbon was mainly deposited, and the surface of clays was covered by a mass of CNTs when 4 CEC of the iron salt or above were used (FIGS. 10[e-i]). The CNTs synthesized at 2, 3, and 4 CECs were relatively short with a low population density (FIG. 10[c-e]), which indicated that the iron salt concentration was not high enough for the efficient growth of nanotubes. As the catalyst concentration increased, the selectivity towards synthesis of CNTs increased. At the 6 CEC, CNTs with higher population density and relatively homogeneous diameters (14.6±4.4 nm) were obtained. By increasing the synthesis concentration to 8 CEC, the nanotubes got thicker and less homogeneous in diameter (16.5±6 nm), which could be due to partial sintering of the catalyst phase leading to a larger catalyst particle size (FIG. 5(i)). According to these results, the best compromise synthesis concentration in order to obtain homogenous CNTs was 6, and 7 CECs, as also was supported by Raman spectroscopy. CNTs were grown in the space between some clay laminas, which have several single mineral layers (e.g., FIG. 10[e-i]).

High-Resolution Transmission Electron Microscopy (HR-TEM)

Figure 11:
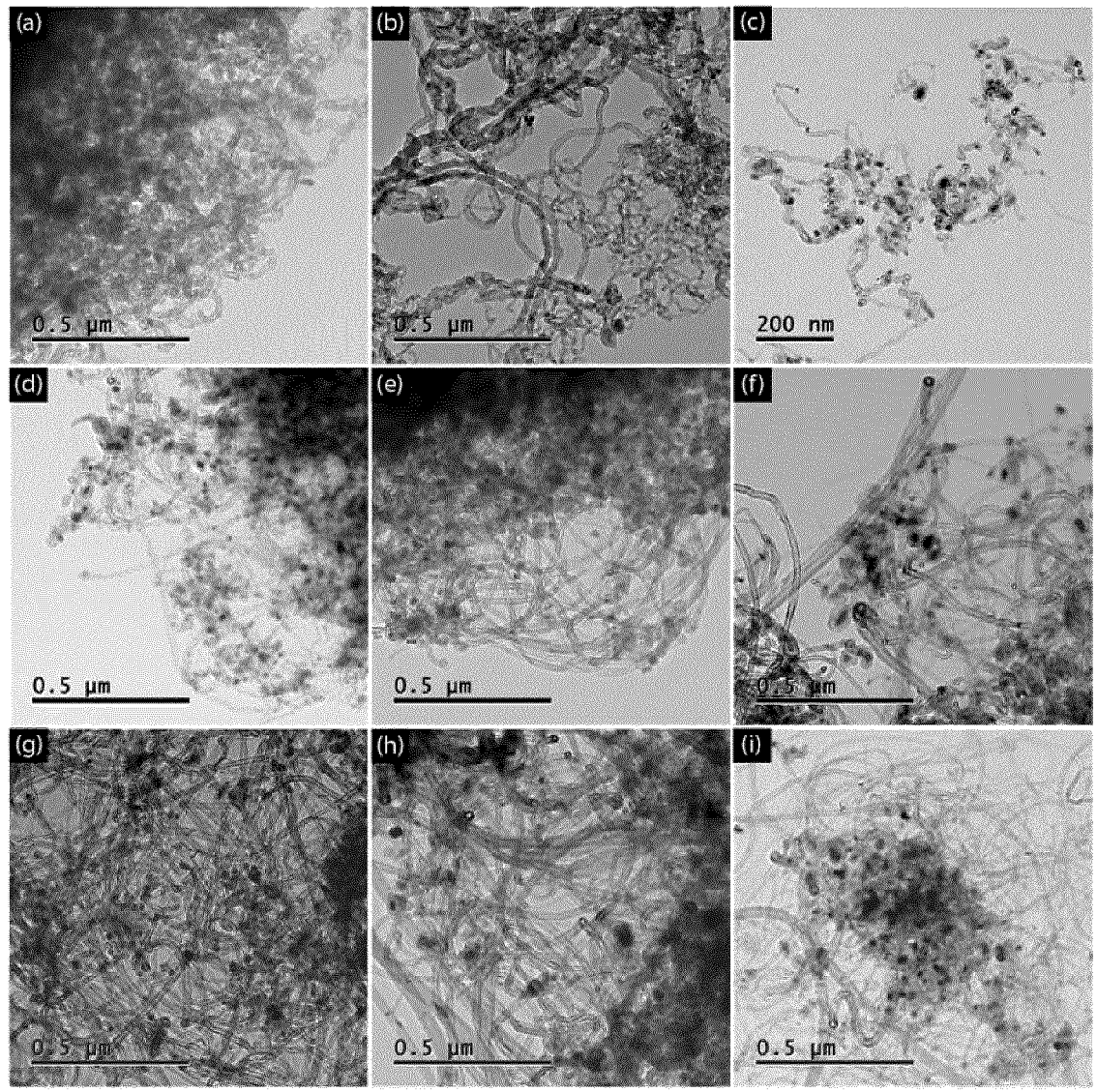
FIG. 11 depicts TEM images of powders of synthesized CNTs on nanoclay by thermal CVD at various CECs of trinuclear acetato complex: a) 0.5, b) 1, c) 2, d) 3, e) 4, f) 5, g) 6, h) 7 and i) 8 CEC [$C_2H_6$ (⅓ vol %), $H_2$ (⅓ vol %) and Ar (⅓ vol %) at 650° C.].
Figure 12:
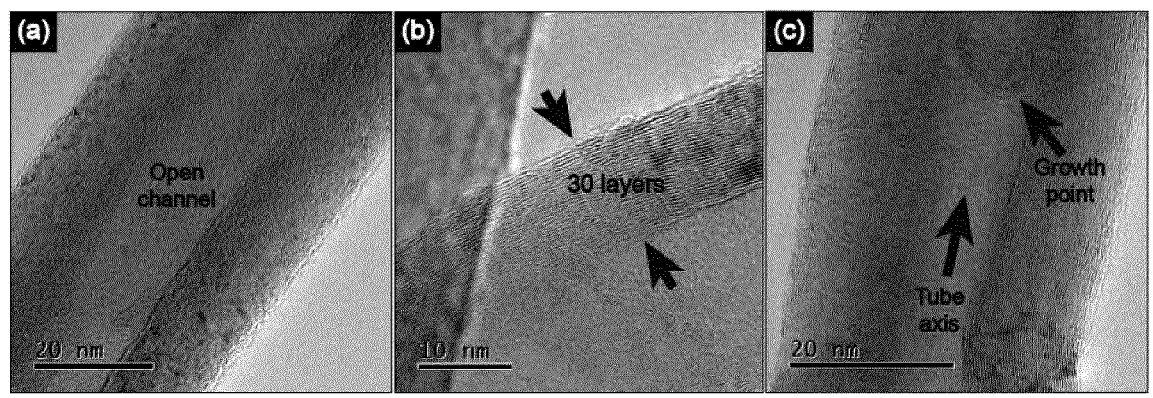
FIG. 12 depicts representative TEM micrographs of the CNTs with an open channel structure along the tube axis for 7 CEC catalyst concentration (a) open channel, (b) 30 layers, (c) tube axis and growth point.

FIG. 11 shows the corresponding HRTEM images of the synthesized CNTs at different concentrations of trinuclear acetato complex. The diameter distribution of CNTs was found by measuring the diameter of 100 individual CNTs in TEM images (FIG. 11). Various carbon deposits such as damaged CNTs, and also structures without the central channel (carbon nanofibers (CNFs)) were observed for 0.5 and 1 CECs CNTs. The large diameter CNTs at 0.5 and 1 CEC CNTs (0.5 CEC (20.4±5.6) and 1 CEC (32±13)) can be due to sintering of the nanoparticles, which may be explained by higher surface area, and therefore, higher activities of the catalyst. The outer diameter of the 2 CEC CNT decreased remarkably compared to those of 0.5 and 1 CECs. This was very similar to the particle size trend formed on the surfaces of the substrates after reduction (Table 5). By increasing the amount of iron complex from 1 to 2 CECs, a transformation occurs from thick CNTs (or nanofibers) to the formation of thinner CNTs with lower diameter distribution. Interestingly, by increasing the concentration above 3 CEC up to 5 CEC, CNT's diameters grew back thicker (so was the particle size [FIG. 5]) with a relatively homogeneous distribution compared with 1 and 2 CEC concentrations. Unexpectedly, the diameter decreased noticeably from 5 to 6 CEC catalyst concentration with lower distribution (18.1±6.8 to 14.8±4.6). The diameter increased again for 7 and 8 CECs catalyst concentrations (~18 nm and ~16.5 nm) with wider distributions. This was consistent with change of their particle size trend in FIG. 5. There are two types of mechanisms for the growth of CNT, base growth and tip growth, which are mostly dependent on the interaction of the catalyst particle with the support. The HRTEM images of the formed CNTs [FIG. 11(c-i)] show the catalyst particles on the end of tubes, indicating that the growth mechanism should be the "tip growth" mechanism. This can be explained by the weak interaction between the iron catalyst and clay surfaces. FIG. 12 shows the representative TEM micrographs of the CNT along the tube axis for 7 CEC CNTs.

The synthesized CNTs over the Fe catalyst were mostly open-channel due to the growth of hexagonal graphitic-based structure. The number of the walls of synthesized CNTs was around 30 layers with a straight region due to the open channel configuration. The presence of a small bamboo shape in FIG. 12(c) inside the walls of the CNT was another start point for the next open channel structure.

TABLE 5

Catalyst particle size and CNT diameters

| Sample | Catalyst particle size (nm) (from ImageJ) | CNT diameter (nm) (from ImageJ) |
|---|---|---|
| 0.5 | 17.75 ± 4.1 | 20.4 ± 5.6 |
| 1 | 27.5 ± 10.1 | 32.9 ± 13.3 |
| 2 | 9.8 ± 3.1 | 12.8 ± 4.4 |
| 3 | 14.6 ± 5.2 | 14.5 ± 5.3 |
| 4 | 17 ± 7.4 | 21.4 ± 10.4 |
| 5 | 18.1 ± 6.8 | 17.8 ± 6.1 |
| 6 | 14.8 ± 4.6 | 14.6 ± 4.4 |
| 7 | 21 ± 6.7 | 18.2 ± 8 |
| 8 | 23 ± 7.4 | 16.5 ± 6 |

Figure 13:
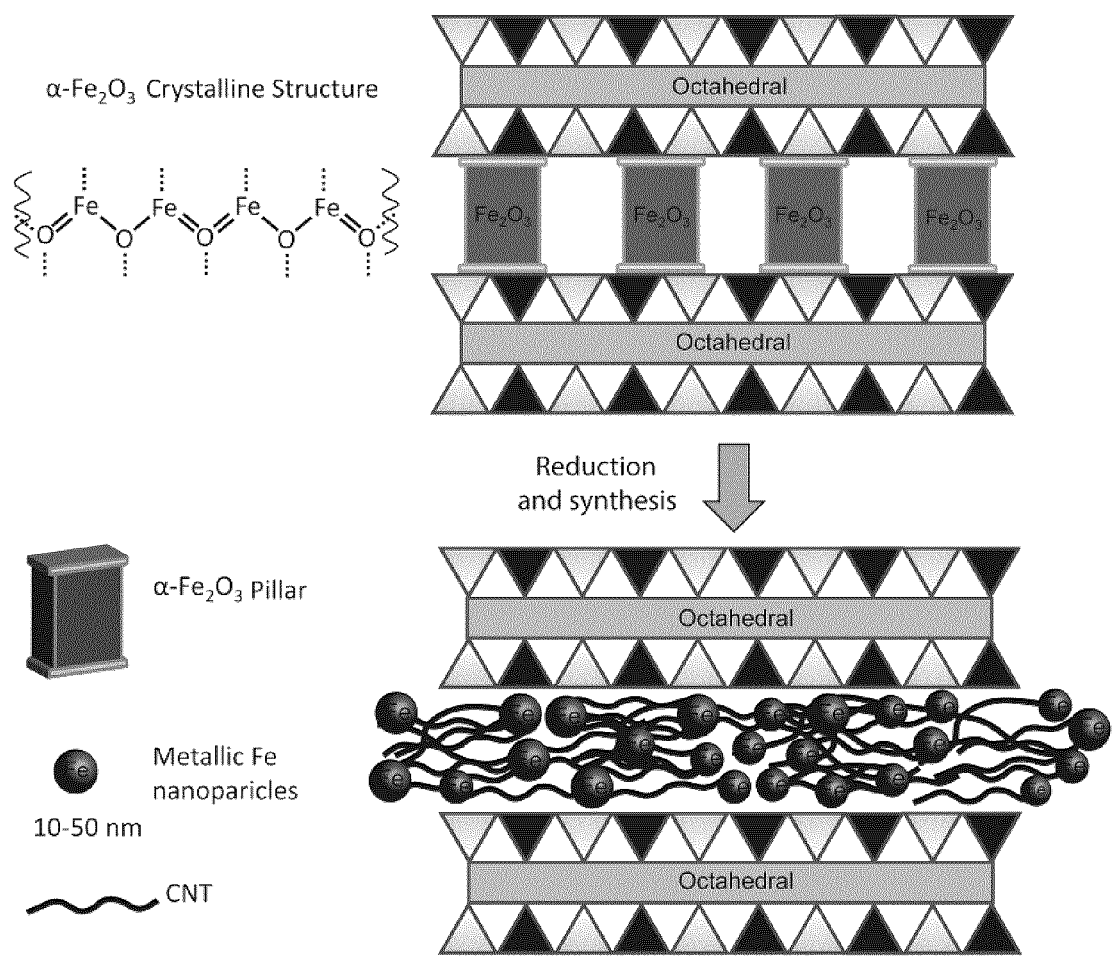
FIG. 13 depicts a schematic description of pillaring and the synthesis of CNT from the Fe-Pillared nanoclay leading to the final clay-CNT structure.

FIG. 13 shows the schematic representation of forming pillars inside the clay galleries. After reduction step, the particles formed for the growth of CNTs. The basic phenomenon used in the preparation of pillared clays was the ion exchange of trinuclear acetate complex by cationic species acting as props to open the interlayer spaces. Pillars formed after dehydration, which converted the complex to stable oxides. The pore size was usually evaluated by measuring the pillar size. The crystalline domain sizes of the iron oxides were measured previously using Scherrer equation and can be applied as a criterion for the pore or pillar sizes. Higher concentrations of exchange (5, 6, 7, and 8 CECs) produced larger crystalline domain size with lower size distribution. This fact seems to show that the complex was better calcined and reduced, because an optimum complex concentration helps formation of the nanoparticles. The concentration of the cation in the solution had great influence on the formation of a thermally stable Fe-PILC. When concentration of the cation was small, non-uniform particles formed, so CNTs with dispersed diameters were produced. In this case the number of pillars was low, rendering the clay substrate thermally unstable. A high concentration of the iron complex did not seem to have big influence on the final product within the studied concentrations (6, 7, and 8 CECs).

Electrical Properties

Figure 14:
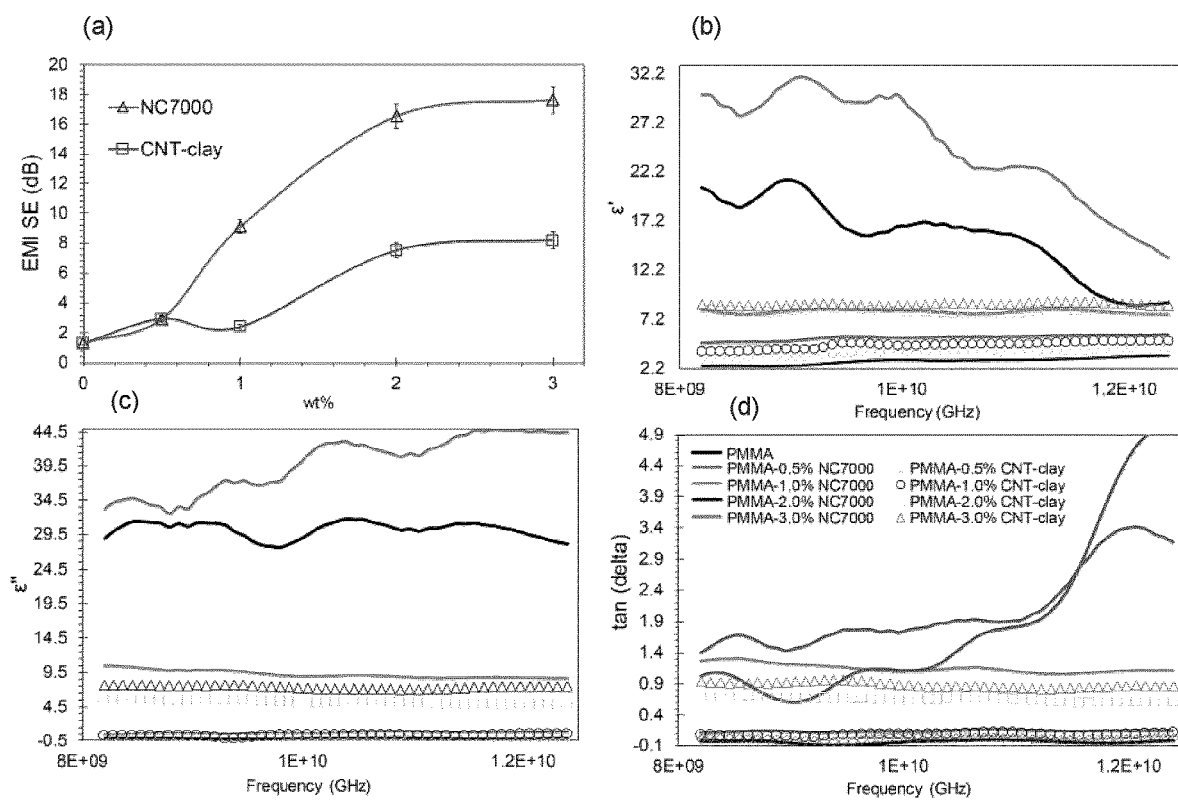
FIG. 14 depicts a) real permittivity (b) imaginary permittivity, (c) tan (δ) as a function of wave frequency, and (d) EMI SE of CNT-PMMA nanocomposites as a function of CNT content.

FIG. 14 shows EMI SE of nanocomposites as a function of CNT content, real permittivity, imaginary permittivity and loss tangent based on frequency for PMMA-CNT nanocomposites. High electrical conductivity is required for a satisfactory EMI shielding[37,38]. Studies showed that well-dispersed CNTs with higher aspect ratio have lower percolation threshold, better electrical conductivity, and therefore, greater EMI shielding. The percolation threshold obtained for PMMA/NC7000™ occurred around 0.5 wt % of the CNT whereas, it was 1 wt. % for clay-CNT/PMMA nanocomposites. This can be due to the presence of clay layers between CNTs in PMMA, preventing the CNTs from direct-contact mechanism in clay-CNT nanocomposites. This resulted in the formation of conductive network at higher CNT contents.

The difference in the percolation of PMMA/clay-CNT and PMMA/NC7000™ can be attributed to several additional parameters, such as carbon purity, aspect ratio of CNTs, crystallinity of CNTs, dispersion, etc. Despite having lower powder conductivity compared to the synthesized clay-CNTs, NC7000™ presented higher shielding. This can be attributed to carbon purity, lower diameter, and/or better dispersion state of NC7000™, providing more interacting surface area towards the incident EM wave. The physical structure of CNTs and level of formation of conductive network are the key parameters affecting the shielding mechanism. In polymer nanocomposites, shielding via absorption originates from Ohmic loss, expressed by imaginary permittivity ($\varepsilon'$), and polarization loss, stated by real permittivity ($\varepsilon'$). Ohmic loss represents the energy dissipation through moving of electrons through conduction, hopping, and tunneling mechanisms within the applied electric field. On the other hand, polarization shows the energy required to reorient dipoles in each half cycle of the alternating field in the X-band frequency range[39-42]. The PMMA/NC7000™ nanocomposites had higher imaginary permittivity ($\varepsilon''$) and lower real permittivity ($\varepsilon'$) compared to clay-CNT nanocomposites. This in fact shows higher tan($\delta$) =$\varepsilon'/\varepsilon''$ indicating lower di-electric properties for PMMA/NC7000™ nanocomposites compared to those of clay-CNTs. Nonetheless, different parameters play roles in the higher imaginary permittivity of nanocomposites. In FIG. 14, PMMA/NC7000™ nanocomposites had slightly lower percolation threshold than PMMA/clay-CNT nanocomposites. This showed formation of superior conductive network, enabling the free charge carriers go through with having more free paths in the alternating field, thus leading to enhanced absorption shielding mechanism[38]. The lower absorption in clay-CNT nanocomposites may be due to hindrance of silicate layers between CNT network and then block the charges. Although the diameter, carbon purity, and dispersion state of nanotubes significantly affect the formation of conductive network formation.

CONCLUSION

A conductive multiwall carbon nanotubes (CNTs) on montmorillonite nanoclay was synthesized through an in situ catalytic chemical vapor deposition of ethane on nanoclay surfaces. The Fe complex precursor: $[Fe_3(OOCCH_3)_7 \cdot OH \cdot nH_2O]^+NO_3^-$, which was identified by chemical analysis and FTIR spectroscopy, was used as the catalyst to perform the ion exchange reaction at different concentrations with the interlayer cations. The Fe-supported clay with the trinuclear Fe (III)-acetato complex resulted in a $Fe_2O_3$-pillared clay after the calcination process. Clay-CNT hybrid nanofiller products with varying CNT content and quality based on different cation exchange capacity of the nanoclay (CEC) were observed and investigated. The obtained CNT was studied using X-ray diffraction, thermal analysis, Raman spectroscopy, scanning electron microscopy, TEM, and measurements. The Raman spectroscopy showed that the intensity of D-band peak decreased with increasing the amount of iron complex added, whereas G and G' bands increased up to 7 CEC of the complex concentration. The CNT yield increased at higher iron content, as the CNTs yield depended primarily on the amount of catalyst available to form the catalyst nanoparticles. The CNT diameter showed an increasing trend from 2 to 5 CECs of the complex, then the CNT diameter decreased from 5 to 6 CEC (~17.8 to ~14.6 nm) with higher nanotube density. The CNT diameter trend was almost similar to the catalyst particle size (average 14.8±4.6 for 6 CEC catalyst). XRD results indicated that Na$^+$MMT layers were intercalated with iron species during the ion-exchange processes and further delaminated due to the growth of CNTs. The 6, 7, and 8 CEC CNTs exhibited smaller diameter, 14.6 (±4.4), 18.2 (±4.4) and 16.5 (±6) of CNTs attached to the clay nanolayers. The di-electric properties showed greater for the PMMA nanocomposites of synthesized CNTs when compared to those of NC7000™ commercial CNT. Further, the complex ammonium iron (III) sulfate dodecahydrate [$NH_4Fe(SO_4)_2 \cdot 12H_2O$] was tested, but it was found that it did not work; and the complex ammonium iron (III) sulfate dodecahydrate [$NH_4Fe(SO_4)_2 \cdot 12H_2O$] was used as a comparison, but it did not appear to result in an ion exchange with clay surfaces.

REFERENCES

1. Zhang, W.-D., Phang, I. Y. & Liu, T. X. Growth of Carbon Nanotubes on Clay: Unique Nanostructured Filler for High-Performance Polymer Nanocomposites. Adv. Mater. 18, 73-77 (2006).
2. Huakang, F., Miao, D. & Qiang, Z. Effect of Iron Concentration on the Growth of Carbon Nanotubes on Clay Surface. ACS Appl. Mater. Interfaces 4, 1981-1989 (2012).
3. A. Bakandritsos, A. Simopoulos, and & Petridis, D. Carbon Nanotube Growth on a Swellable Clay Matrix. (2005). doi:10.1021/CM0482131
4. Shaijumon, M. M., Bejoy, N. & Ramaprabhu, S. Catalytic growth of carbon nanotubes over Ni/Cr hydrotalcite-type anionic clay and their hydrogen storage properties. Appl. Surf. Sci. 242, 192-198 (2005).
5. Gournis, D., Karakassides, M., Bakas, T., Boukos, N. & Petridis, D. Catalytic synthesis of carbon nanotubes on clay minerals. Carbon N. Y. 40, 2641-2646 (2002).
6. Huang, S. et al. Assembling Exfoliated Layered Double Hydroxide (LDH) Nanosheet/Carbon Nanotube (CNT) Hybrids via Electrostatic Force and Fabricating Nylon Nanocomposites. J. Phys. Chem. B 114, 16766-16772 (2010).
7. Asgari, M., Abouelmagd, A. & Sundararaj, U. Silane functionalization of sodium montmorillonite nanoclay and its effect on rheological and mechanical properties of HDPE/clay nanocomposites. Appl. Clay Sci. 146, 439-448 (2017).
8. Asgari, M. & Sundararaj, U. Pre-exfoliated nanoclay through two consecutive reaction systems: Silane functionalization followed by grafting of amino acid monomers. Appl. Clay Sci. 151, 81-91 (2018).
9. Asgari, M. & Sundararaj, U. Silane functionalization of sodium montmorillonite nanoclay: The effect of dispersing media on intercalation and chemical grafting. Appl. Clay Sci. 153, 228-238 (2018).
10. Park, M. et al. Intercalation of magnesium-urea complex into swelling clay. J. Phys. Chem. Solids 65, 409-412 (2004).
11. Ayyappan, S., Subbanna, G. N., Gopalan, R. S. & Rao, C. N. R. Nanoparticles of nickel and silver produced by the polyol reduction of the metal salts intercalated in montmorillonite. Solid State Ionics 84, 271-281 (1996).
12. Van Chuc, N. et al. A Simple Approach to the Fabrication of Graphene-Carbon Nanotube Hybrid Films on Copper Substrate by Chemical Vapor Deposition. J. Mater. Sci. Technol. 31, 479-483 (2015).
13. Sankararamakrishnan, N., Chauhan, D. & Dwivedi, J. Synthesis of functionalized carbon nanotubes by floating catalytic chemical vapor deposition method and their sorption behavior toward arsenic. Chem. Eng. J. 284, 599-608 (2016).
14. G. Che, B. B. Lakshmi, C. R. Martin, and, Fisher, E. R. & Ruoff, R. S. Chemical Vapor Deposition Based Synthesis of Carbon Nanotubes and Nanofibers Using a Template Method. (1998). doi:10.1021/CM970412F.
15. Wei, D. et al. Synthesis of N-Doped Graphene by Chemical Vapor Deposition and Its Electrical Properties. Nano Lett. 9, 1752-1758 (2009).
16. Lee, C. J., Park, J. & Yu, J. A. Catalyst effect on carbon nanotubes synthesized by thermal chemical vapor deposition. Chem. Phys. Lett. 360, 250-255 (2002).
17. Bronikowski, M. J. Longer Nanotubes at Lower Temperatures: The Influence of Effective Activation Energies on Carbon Nanotube Growth by Thermal Chemical Vapor Depositiont. (2007). doi:10.1021/JP071079Y.
18. Couteau, E. et al. CVD synthesis of high-purity multi-walled carbon nanotubes using $CaCO_3$ catalyst support for large-scale production. Chem. Phys. Lett. 378, 9-17 (2003).
19. Lau, K. et al. Cobalt hydroxide colloidal particles precipitation on nanoclay layers for the formation of novel nanocomposites of carbon nanotubes/nanoclay. Compos. Sci. Technol. 66, 450-458 (2006).
20. Spitalsky, Z., Tasis, D., Papagelis, K. & Galiotis, C. Carbon nanotube-polymer composites: Chemistry, processing, mechanical and electrical properties. Prog. Polym. Sci. 35, 357-401 (2010).
21. Manikandan, D., Mangalaraja, R. V., Siddheswaran, R., Avila, R. E. & Ananthakumar, S. Fabrication of nanostructured clay-carbon nanotube hybrid nanofiller by chemical vapour deposition. Appl. Surf. Sci. 258, 4460-4466 (2012).
22. Chen, J. P., Hausladen, M. C. & Yang, R. T. Delaminated Fe2O3-Pillared Clay: Its Preparation, Characterization, and Activities for Selective Catalytic Reduction of No by $NH_3$. J. Catal. 151, 135-146 (1995).
23. Maes, N. & Vansant, E. F. Study of Fe2O3-pillared clays synthesized using the trinuclear Fe(III)-acetato complex as pillaring precursor. Microporous Mater. 4, 43-51 (1995).
24. Berkheiser, V. E. & Mortland, M. M. Hectorite complexes with Cu(II) and Fe(II)-1,10-phenanthroline chelates. Clays Clay Miner. (1977). doi:10.1346/CCMN.1977.0250206
25. Pérez Zurita, M. J., Vitale, G., de Goldwasser, M. R., Rojas, D. & Garcia, J. J. Fe-pillared clays: a combination of zeolite shape selectivity and iron activity in the CO hydrogenation reaction. J. Mol. Catal. A Chem. 107, 175-183 (1996).'
26. Yamanaka, S., Doi, T., Sako, S. & Hattori, M. HIGH SURFACE AREA Solids obtained by intercalation of iron oxide pillars in montmorillonite. Mat. Res. Bull 19, 161-168 (1984).
27. Han, Y.-S., Yamanaka, S. & Choy, J.-H. A new thermally stable $SiO_2$—$Cr_2O_3$ sol pillared montmorillonite with high surface area. Appl. Catal. A Gen. 174, 83-90 (1998).
28. Yamanaka, S. & Hattori, M. Iron oxide pillared clay. Catal. Today 2, 261-270 (1988).
29. Rightor, E. G., Tzou, M.-S. & Pinnavaia, T. J. Iron oxide pillared clay with large gallery height: Synthesis and properties as a Fischer-Tropsch catalyst. J. Catal. 130, 29-40 (1991).
30. Doff, D. H., Gangas, N. H. J., Allant, J. E. M. & Coeyt, J. M. D. Preparation and characterization of iron oxide pillared montmorillonite. Clay Miner. 0988, 367-377.

31. Thostenson, E. T., Ren, Z. & Chou, T.-W. Advances in the science and technology of carbon nanotubes and their composites: a review. Compos. Sci. Technol. 61, 1899-1912 (2001).
32. Madaleno, L. et al. Synthesis of clay-carbon nanotube hybrids: Growth of carbon nanotubes in different types of iron modified montmorillonite. Compos. Sci. Technol. 72, 377-381 (2012).
33. Snow, E. S., Perkins, F. K., Houser, E. J., Badescu, S. C. & Reinecke, T. L. Chemical Detection with a Single-Walled Carbon Nanotube Capacitor. Science (80-). 307, 1942-1945 (2005).
34. Bulusheva, L. G. et al. Electrochemical properties of nitrogen-doped carbon nanotube anode in Li-ion batteries. Carbon N. Y. 49, 4013-4023 (2011).
35. Zhao, Q. & Wagner, H. D. Raman spectroscopy of carbon-nanotube-based composites. Philos. Trans. A. Math. Phys. Eng. Sci. 362, 2407-24 (2004).
36. Ferrari, A. C. & Robertson, J. Interpretation of Raman spectra of disordered and amorphous carbon. Phys. Rev. B 61, 14095-14107 (2000).
37. Maiti, S., Shrivastava, N. K., Suin, S. & Khatua, B. B. Polystyrene/MWCNT/Graphite Nanoplate Nanocomposites: Efficient Electromagnetic Interference Shielding Material through Graphite Nanoplate-MWCNT-Graphite Nanoplate Networking. ACS Appl. Mater. Interfaces 5, 4712-4724 (2013).
38. Al-Saleh, M. H. & Sundararaj, U. Electromagnetic interference shielding mechanisms of CNT/polymer composites. (2009). doi:10.1016/j.carbon.2009.02.030
39. Kaiser, A. B., Dusberg, G. & Roth, S. Heterogeneous model for conduction in carbon nanotubes. Phys. Rev. B 57, 1418-1421 (1998).
40. Pötschke, P., Abdel-Goad, M., Alig, I., Dudkin, S. & Lellinger, D. Rheological and dielectrical characterization of melt mixed polycarbonate-multiwalled carbon nanotube composites. Polymer (Guildf). 45, 8863-8870 (2004).
41. Odom, T. W., Huang, J.-L., Kim, P. & Lieber, C. M. Atomic structure and electronic properties of single-walled carbon nanotubes. Nature 391, 62-64 (1998).
42. Hewitt, C. A. et al. Multilayered Carbon Nanotube/Polymer Composite Based Thermoelectric Fabrics. Nano Lett. 12, 1307-1310 (2012).

The embodiments described herein are intended to be examples only. Alterations, modifications and variations can be effected to the particular embodiments by those of skill in the art. The scope of the claims should not be limited by the particular embodiments set forth herein, but should be construed in a manner consistent with the specification as a whole.

All publications, patents and patent applications mentioned in this Specification are indicative of the level of skill those skilled in the art to which this invention pertains and are herein incorporated by reference to the same extent as if each individual publication patent, or patent application was specifically and individually indicated to be incorporated by reference.

The invention being thus described, it will be obvious that the same may be varied in many ways. Such variations are not to be regarded as a departure from the spirit and scope of the invention, and all such modification as would be obvious to one skilled in the art are intended to be included within the scope of the following claims.

What is claimed is:

1. A nanomaterial, comprising:
    a nanoclay,
    the nanoclay having a layered structure; and
    carbon nanotubes,
    the carbon nanotubes being intercalated between layers of the layered structure of the nanoclay, and wherein:
    (a) the carbon nanotubes comprise an $I_D/I_G$ Raman intensity ratio or $A_D/A_G$ Raman area ratio that is less than 2; or less than 1.5; or less than 1;
    (b) the carbon nanotubes comprise approximately 75% to approximately 90% $sp^2$ carbon bonding; or approximately 80% to approximately 90% $sp^2$ carbon bonding; or approximately 85% to approximately 90% $sp^2$ carbon bonding;
    (c) the carbon nanotubes comprise an $I_G/I_G$ Raman intensity ratio that is about 0.2 to about 1;
    (d) the carbon nanotubes have a high aspect ratio of about 300 to about 1000; or
    (e) the nanomaterial has a powder conductivity of about 10-8 S/cm to about 100 S/cm.

2. The nanomaterial of claim 1, wherein the carbon nanotubes comprise approximately 75% to approximately 90% $sp^2$ carbon bonding; or approximately 80% to approximately 90% $sp^2$ carbon bonding; or approximately 85% to approximately 90% $sp^2$ carbon bonding.

3. The nanomaterial of claim 1, wherein the carbon nanotubes comprise the $I_G/I_G$ Raman intensity ratio of about 0.2 to about 1.

4. The nanomaterial of claim 1, wherein the carbon nanotubes have the high aspect ratio of about 300 to about 1000.

5. The nanomaterial of claim 1, wherein the nanomaterial has the powder conductivity of about $10^{-8}$ S/cm to about 100 S/cm.

6. The nanomaterial of claim 1, wherein the nanoclay is a montmorillonite nanoclay, a bentonite nanoclay, a hectorite nanoclay, a saponite nanoclay, a halloysite nanoclay, a kaolin nanoclay, a laponite nanoclay, a vermiculite nanoclay, or a combination thereof.

7. A nanocomposite material comprising:
    a polymer; and
    a nanomaterial comprising a nanoclay and carbon nanotubes, wherein the nanoclay has a layered structure and the carbon nanotubes are intercalated between layers of the layered structure of the nanoclay,
    wherein the nanomaterial is dispersed throughout the polymer; and wherein:
    (a) the nanocomposite material exhibits a percolation threshold at a nanomaterial concentration of about 0.1 wt % to about 2 wt %; or about 0.1 wt % to about 5 wt %;
    (b) the nanocomposite material exhibits an EMI shielding of about 8 to about 10; or
    (c) the nanocomposite material has a loss tangent that is less than 1; or less than 0.8; or less than 0.5.

8. The nanocomposite material of claim 7, wherein the nanocomposite material exhibits the EMI shielding of about 8 to about 10.

9. The nanocomposite material of claim 7, wherein the nanocomposite material has the loss tangent that is less than 1; or less than 0.8; or less than 0.5.

10. The nanocomposite material of claim 7, wherein the nanomaterial is at a concentration of about 0.1 wt % to about 5 wt %.

11. The nanocomposite material of claim 7, wherein the polymer is a thermoplastic, an engineering thermoplastic, an elastomer, a thermoplastic elastomer, a thermoset material, or a combination thereof.

* * * * *